(12) United States Patent
Iwashita et al.

(10) Patent No.: US 7,573,054 B2
(45) Date of Patent: Aug. 11, 2009

(54) EDGE EXPOSURE APPARATUS, COATING AND DEVELOPING APPARATUS, AND EDGE EXPOSURE METHOD

(75) Inventors: Yasuharu Iwashita, Koshi (JP); Ichiro Shimomura, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 356 days.

(21) Appl. No.: 11/417,163

(22) Filed: May 4, 2006

(65) Prior Publication Data

US 2006/0250594 A1    Nov. 9, 2006

(30) Foreign Application Priority Data

May 9, 2005    (JP) .............................. 2005-136575

(51) Int. Cl.
*G01V 8/00*    (2006.01)
(52) U.S. Cl. .................................... 250/559.36; 355/53
(58) Field of Classification Search ............ 250/559.36, 250/227.11, 548, 202
See application file for complete search history.

(56) References Cited

U.S. PATENT DOCUMENTS

| | | | |
|---|---|---|---|
| 4,910,549 A | 3/1990 | Sugita | |
| 5,929,976 A | 7/1999 | Shibuya et al. | |
| 6,052,173 A | 4/2000 | Miura et al. | |
| 6,147,745 A * | 11/2000 | Kim et al. | 355/67 |
| 6,240,874 B1 | 6/2001 | Pike | |
| 2005/0062951 A1 | 3/2005 | Akiyama et al. | |
| 2006/0068093 A1 * | 3/2006 | Shite | 427/240 |
| 2006/0139591 A1 * | 6/2006 | Jung | 355/53 |

FOREIGN PATENT DOCUMENTS

| | | |
|---|---|---|
| EP | 0 788 032 | 8/1997 |
| EP | 0 920 053 | 6/1999 |
| JP | 2-177420 | 7/1990 |
| JP | 10-335216 | 12/1998 |
| JP | 11-219894 | 8/1999 |
| JP | 2003-347187 | 12/2003 |
| KR | 2002-0089616 | 11/2002 |
| KR | 2002-0094504 | 12/2002 |
| KR | 2004-0011792 | 2/2004 |
| KR | 2004-0024165 | 3/2004 |

* cited by examiner

*Primary Examiner*—Georgia Y Epps
*Assistant Examiner*—Kevin Wyatt
(74) *Attorney, Agent, or Firm*—Smith, Gambrell & Russell, LLP

(57) ABSTRACT

The present invention includes a first and a second optical path forming member arranged within a path of light beams from a light source; a first mounting table provided such that the edge portion of the substrate is located within an application region of the light beams from an outlet side of the first optical path forming member, and a second mounting table provided such that the edge portion of the substrate is located within an application region of the light beams from an outlet side of the second optical path forming member, each of the mounting tables being configured to be rotatable about a vertical axis while mounting the substrate thereon; and a light blocking means for blocking application of light from each of the first and second optical path forming members. A common light source can be used to perform edge exposure for the substrates on the first and second mounting tables, for example, at the same time, so that a high processing ability can be offered and an increase in size of the apparatus can be prevented.

18 Claims, 17 Drawing Sheets

EDGE EXPOSURE APPARATUS, COATING AND DEVELOPING APPARATUS, AND EDGE EXPOSURE METHOD

BACKGROUND OF THE INVENTION

1. Field of the Invention

The present invention relates to an edge exposure apparatus for performing exposure for an edge portion of a substrate coated with a photosensitive material such as a resist or the like by applying light thereto, a coating and developing apparatus using the edge exposure apparatus, and an edge exposure method.

2. Description of the Related Art

As an apparatus for forming a resist pattern on a substrate such as a semiconductor wafer (hereinafter, referred to as a wafer), for example, a coating and developing apparatus is employed which applies a photoresist (hereinafter, referred to as a resist) for the wafer and develops the wafer which has been exposed to light in an aligner. In this coating and developing apparatus, the application of the resist is performed in particular by supplying the resist onto the wafer being rotated so that the resist spreads over the front surface of the wafer by a centrifugal force, so that the resist is applied over the entire front surface of the wafer. A peripheral portion (an edge portion) of the wafer, however, is rarely used as a pattern formation region, and therefore the peripheral portion may not be exposed in the aligner. In that case, a positive-type resist, when used as the aforementioned resist, remains on the peripheral portion even after development. This resist can peel off, for example, during carriage of the wafer into particles which contaminate the front surface of the wafer, causing a decrease in yield.

To prevent such a trouble, an edge exposure apparatus for exposing the peripheral portion of the wafer is provided in the coating and developing apparatus. The edge exposure apparatus is provided, for example, in an interface section which serves to connect the coating and developing apparatus and an aligner for performing exposure processing to form a resist pattern. Edge exposure processing is performed by the edge exposure apparatus for the wafer before subjected to exposure in the aligner, and developing treatment is then performed so that an unnecessary resist at the peripheral portion of the wafer is removed.

However, the throughput of wafers required in the coating and developing apparatus increases in recent years, and it is required to attain a throughput of, for example, 180 to 200 wafers per hour in these days. To increase the throughput, it is conceivable, for example, to additionally provide edge exposure apparatuses in the aforementioned interface section. The provision of additional apparatuses, however, can increase the size of the interface section or fail to ensure a sufficient space to perform maintenance of the edge exposure apparatuses and change of lamps (light sources) in the interface section. The provision of additional edge exposure apparatuses increases the total of the amounts of heat ration from the light sources provided in the edge exposure apparatuses, thus presenting a concern about increasing the effect exerted on other modules in the interface section.

The Japanese Patent Application Laid-open No. Hei 11-219894 discloses a down-sized edge exposure apparatus targeted to simplify a mechanism of aligning a wafer, and discloses no teaching about the means for solving the problem relating to the above-described throughput. The Japanese Patent Application Laid-open No. 2003-347187 discloses an edge exposure apparatus targeted to increase the throughput which has, however, an apparatus configuration assuming that a plurality of light sources are provided, and discloses no teaching about the means for solving the above-described problem.

SUMMARY OF THE INVENTION

The present invention has been developed under such circumstances, and its object is to provide an edge exposure apparatus and an edge exposure method each having a high ability of processing the substrate without increasing the size of the apparatus. Another object of the present invention is to provide a coating and developing apparatus capable of increasing the throughput through use of the edge exposure apparatus.

The present invention is an edge exposure apparatus for exposing an edge portion of a substrate having a photosensitive thin film formed thereon by a light source for exposure, including: a first optical path forming member and a second optical path forming member with respective inlet sides arranged within light beams from the light source; a first mounting table configured to be rotatable about a vertical axis while mounting the substrate thereon, and provided such that the edge portion of the substrate is located within an application region of the light beams from an outlet side of the first optical path forming member; a second mounting table configured to be rotatable about a vertical axis while mounting the substrate thereon, and provided such that the edge portion of the substrate is located within an application region of the light beams from an outlet side of the second optical path forming member; and a light blocking means for blocking application of light from each of the first optical path forming member and the second optical path forming member.

The light blocking means may include, for example, a first shutter for blocking an optical path formed by the first optical path forming member and a second shutter for blocking an optical path formed by the second optical path forming member. In this case, for example, each of the first optical path forming member and the second optical path forming member may include a light guide rod and a lens for condensing light from the light guide rod, and each of the first shutter and the second shutter may be provided between the light guide rod and the lens. Further, the light blocking means may include means for relatively moving the first optical path forming member and second optical path forming member and the light source between a state where one of the base end sides of the first optical path forming member and second optical path forming member is located within the light beams from the light source and the other is not located within the light beams, and a state where both of the base end sides of the first optical path forming member and second optical path forming member are located within the light beams from the light source.

According to another aspect, the present invention is an edge exposure apparatus for exposing an edge portion of a substrate having a photosensitive thin film formed thereon by a light source for exposure, including: a first optical path forming member and a second optical path forming member receiving light beams from the light source incident on respective inlet sides thereof; means for relatively moving the light source and the first optical path forming member and second optical path forming member so that the light beams alternately pass through the inlet side of the first optical path forming member and the inlet side of the second optical path forming member; a first mounting table configured to be rotatable about a vertical axis while mounting the substrate thereon, and provided such that the edge portion of the substrate is located within an application region of the light beams from an outlet side of the first optical path forming member; and a second mounting table configured to be rotatable about a vertical axis while mounting the substrate thereon, and provided such that the edge portion of the substrate is located within an application region of the light beams from an outlet side of the second optical path forming member.

In the edge exposure apparatus of the present invention, the first mounting table and the second mounting table may be placed one on the other. Further, each of the first optical path forming member and the second optical path forming member may include a light guide rod in a square shape. The inlet side of each of the optical path forming members may be on a base end side of the light guide rod. Furthermore, each of the optical path forming members may include a light guide rod made by forming an antireflection film on a side peripheral surface of a quartz rod.

According to another aspect, the present invention is a coating and developing apparatus including a carrier block into which a wafer carrier housing a plurality of wafers is carried; a processing block in which a coating unit for applying a resist solution to a front surface of a wafer taken out of the carrier carried into the carrier block and a developing unit for supplying a developing solution to the wafer after exposure for development are provided; and an interface section connected to an aligner for performing the exposure for the front surface of the wafer, the apparatus including the above-described edge exposure apparatus.

According to still another aspect, the present invention is an edge exposure method of exposing an edge portion of a substrate having a photosensitive thin film formed thereon by a light source for exposure, including the steps of: light beams from the light source being made incident on a first optical path forming member and a second optical path forming member with respective inlet sides arranged within the light beams; mounting the substrate on a first mounting table and rotating the substrate about a vertical axis, and exposing the edge portion of the substrate to the light beams from an outlet side of the first optical path forming member; blocking application of light from the second optical path forming member when exposure is being performed for the edge portion of the substrate on the first mounting table; and mounting the substrate on a second mounting table and rotating the substrate about a vertical axis, and releasing the block of the application of the light from the second optical path forming member to expose the edge portion of the substrate to the light beams from an outlet side of the second optical path forming member.

According to yet another aspect, the present invention is an edge exposure method of exposing an edge portion of a substrate having a photosensitive thin film formed thereon by a light source for exposure, including the steps of: relatively moving the light source and a first optical path forming member so that light beams from the light source are located at a position passing through an inlet side of the first optical path forming member, rotating the substrate mounted on a first mounting table about a vertical axis, and exposing the edge portion of the substrate to the light beams from an outlet side of the first optical path forming member; and relatively moving the light source and the first optical path forming member and a second optical path forming member so that the light beams from the light source deviate from the inlet side of the first optical path forming member and are located at a position passing through an inlet side of the second optical path forming member, rotating the substrate mounted on a second mounting table about a vertical axis, and exposing the edge portion of the substrate to the light beams from an outlet side of the second optical path forming member.

In these edge exposure methods, the first mounting table and the second mounting table may be placed one on the other. Further, each of the first optical path forming member and the second optical path forming member may include a light guide rod in a square shape. The inlet side of each of the optical path forming members may be on a base end side of the light guide rod.

According to the present invention, a common light source can be used to perform edge exposure to the substrate on the first mounting table and the substrate on the second mounting table, for example, at the same time. This can offer a high processing ability and prevent an increase in size of the apparatus. To efficiently expose the edge portion of the substrate, it is effective to make the light guide rod being the optical path forming member in a square shape. In this case, the first light guide rod and the second light guide rod in a square shape are located within a circular beam spot of the light source, whereby a waste region of the beams can be reduced, resulting in energy saving. Further, when the first mounting table and the second mounting table are placed one on the other, the installation space can be reduced.

According to the edge exposure method of the present invention, the light beams from the light source alternately pass through the inlet side of the first optical path forming member and the inlet side of the second optical path forming member to perform edge exposure in sequence for the substrate on the first mounting table and the substrate on the second mounting table, thereby offering a higher processing ability than the case using one mounting table, and the common light source is used, thereby preventing an increase in size of the edge exposure apparatus.

In addition, the edge exposure apparatus of the present invention is incorporated in a coating and developing apparatus for forming a resist pattern, thereby ensuring an increased throughput without increasing the size of the coating and developing apparatus.

DETAILED DESCRIPTION OF THE PREFERRED EMBODIMENT

Figure 1:
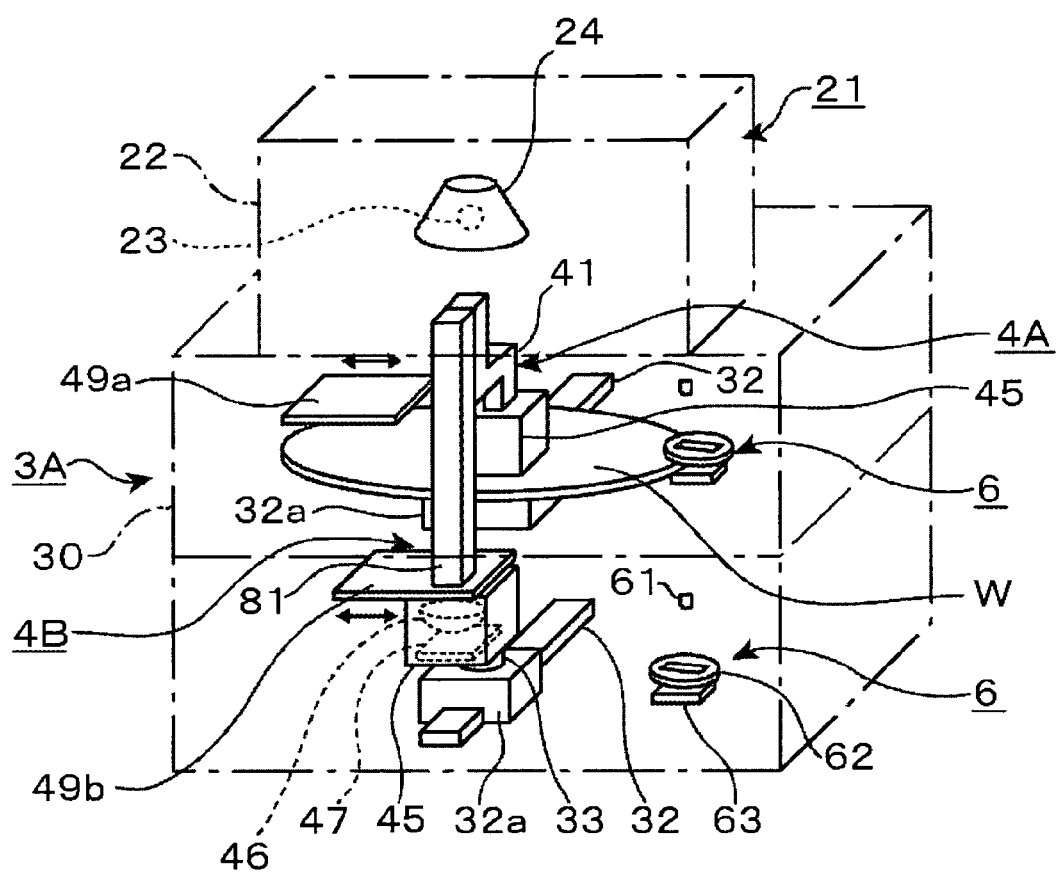
FIG. 1 is a perspective view showing one example of an embodiment of an edge exposure apparatus in the present invention.

As an example of an embodiment of an edge exposure apparatus carrying out an edge exposure method relating to the present invention, an edge exposure apparatus 2 for exposing an edge portion of a semiconductor wafer W that is a substrate on which a resist film is formed by applying a resist solution being a coating solution of a photosensitive material to the surface will be described below with reference to FIG. 1 to FIG. 3. It should be noted that the wafer W used herein is provided with a notch N that is a cut-out portion indicating a position in a crystal orientation of the wafer W, for example, at the edge portion as shown in FIG. 3.

The edge exposure apparatus 2 comprises a light source unit 21, a first and a second exposure unit 3A and 3B, a first and a second optical path forming unit 4A and 4B, and an alignment unit 6. The light source unit 21 comprises, for example, a casing 22 in which a light source 23 radially emitting light employing, for example, a ultra-high pressure mercury or xenon flash is provided. Around the light source 23, a reflector 24 is provided in a manner to cover the light source 23, so that the reflector 24 reflects a portion of the light radiated from the light source 23 to apply the light as beams to an incident surface of a later-described first light guide rod 42 and second light guide rod 82 of the first and second optical path forming units 4A and 4B (details will be described later).

The reflector 24 and the light source 23 may be moved in a direction shown by arrows in the drawing, that is, along a direction in which the later-described first and second optical path forming units 4A and 4B are arranged side by side, by a drive motor 24a, for example, a pulse motor or the like. The moving amount or the like may be controlled by a controller 24b.

Under the light source unit 21, the first exposure unit 3A and the second exposure unit 3B are stacked in this order downward. The first exposure unit 3A comprises a casing 30 having a carry port 31 for carrying the wafer W into the casing 30 provided, for example, on the side surface facing a carry region of the wafer W. Assuming that the side where the carry port 31 is provided is the front side, a guide rail 32 extends from the front side to the rear side at a lower portion in the casing 30, and a base table 32a is provided on the guide rail 32 in a manner to be guided. On the top of the base table 32a, a rotary mechanism 33 is provided, and on the top of the rotary mechanism 33, a stage 34 being a first mounting table, for example, in a circular shape is provided on which the wafer W is to be mounted. The first stage 34 is configured to be rotatable around the vertical axis via the rotary mechanism 33 and configured as a vacuum chuck capable of horizontally holding the wafer W, for example, by vacuum-sucking the central portion of the rear surface of the wafer W. Further, in the casing 30, a not-shown drive unit composed of, for example, a mechanism using a ball screw or a mechanism using a pulley and a belt, so that the base table 32a is configured to be movable along the guide rail 32 together with the rotary mechanism 33 and the first stage 34 via the drive unit. This configuration allows the first stage 34 to receive the wafer W from a later-described carrier mechanism 5 at a predetermined position on the front side (regarded as a transfer position) and carry the wafer W to a predetermined position on the rear side (regarded as an exposure position) where edge exposure it performed.

The second exposure unit 3B comprises a stage 35 being a second mounting table in place of the first stage 34, the second stage 35 being configured, for example, similarly to the first stage 34. The configurations of other units in the second exposure unit 3B are the same as the configurations of the units in the first exposure unit 3A.

Figure 2:
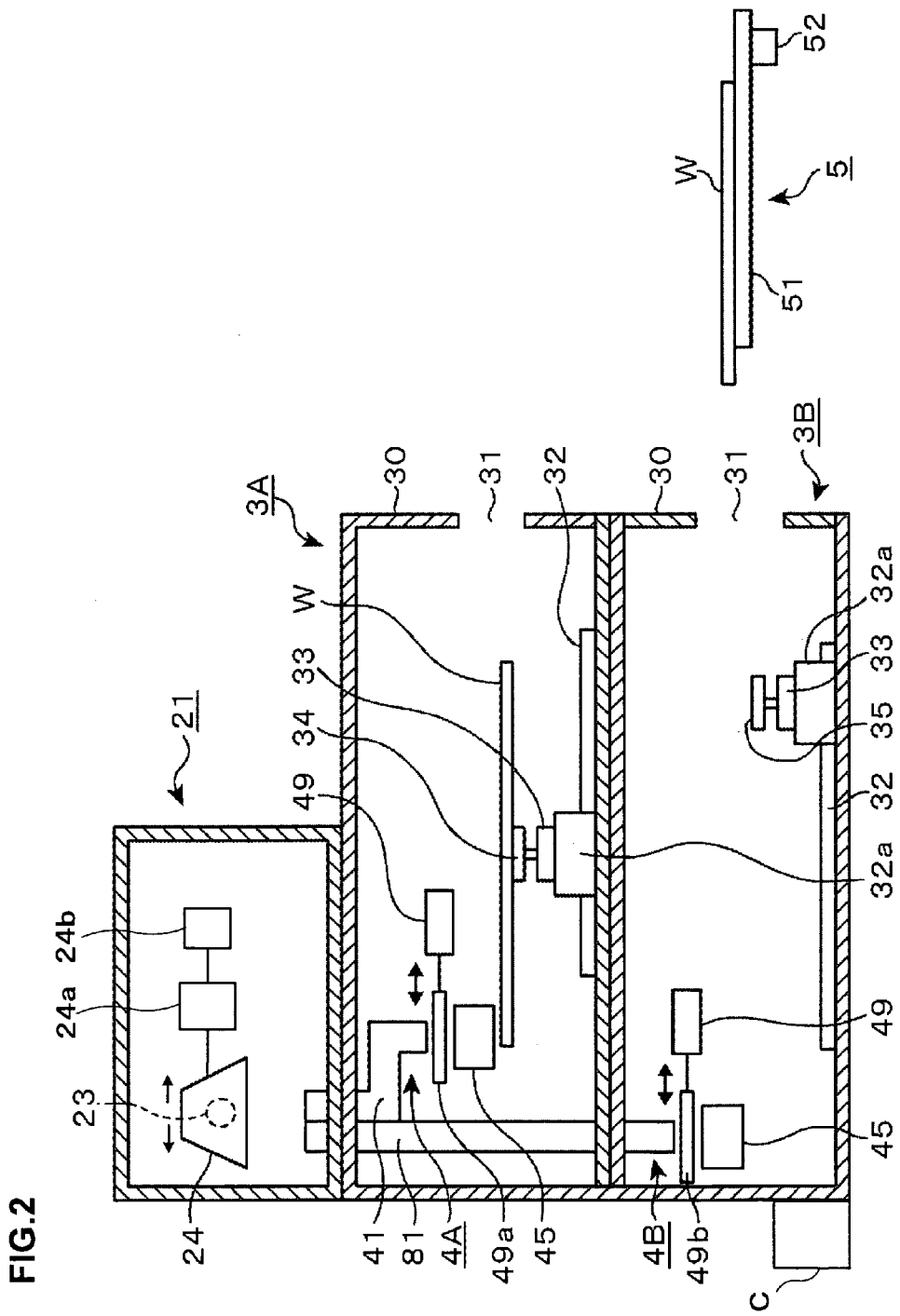
FIG. 2 is a longitudinal side view of the edge exposure apparatus in FIG. 1.
Figure 3:
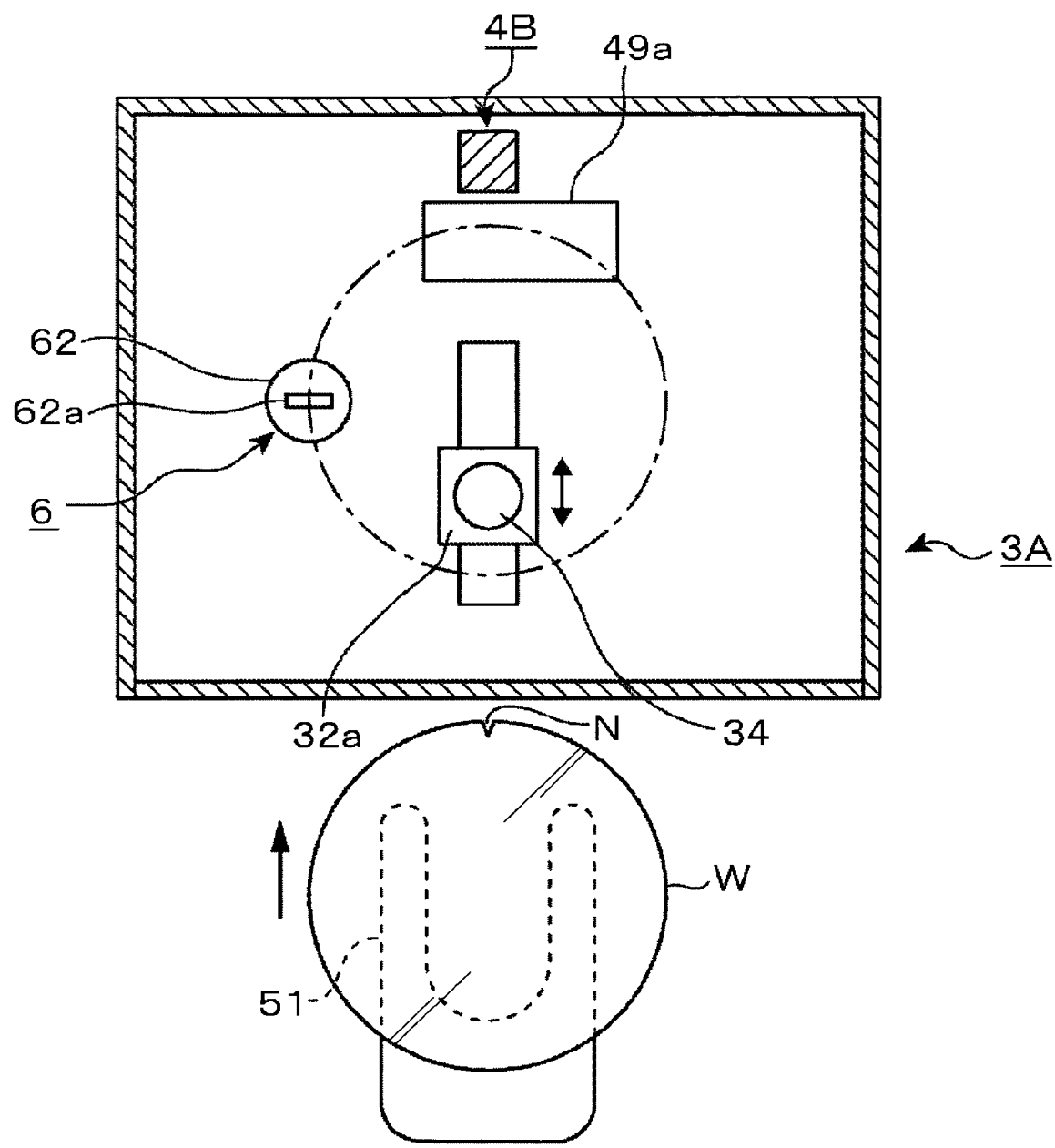
FIG. 3 is a transverse side view of the edge exposure apparatus in FIG. 1.

The carrier mechanism 5 comprises, for example, a carrier arm 51 for supporting the rear surface of the wafer W and a carrier base 52 for supporting the carrier arm 51 as shown in FIG. 2 and FIG. 3, and the carrier base 52 is connected, for example, to the not-shown drive unit. The carrier arm 51 is configured, for example, to freely move back and forth, freely rise and lower, and freely rotate about the vertical axis via the carrier base 52 so that the carrier arm 51 supporting the wafer W enters the casing 30 of the first exposure unit 30A or the second exposure unit 30B via the carry port 31 to mount the wafer W onto the first or second stage 34 or 35 which has moved to the transfer position.

Figure 4:
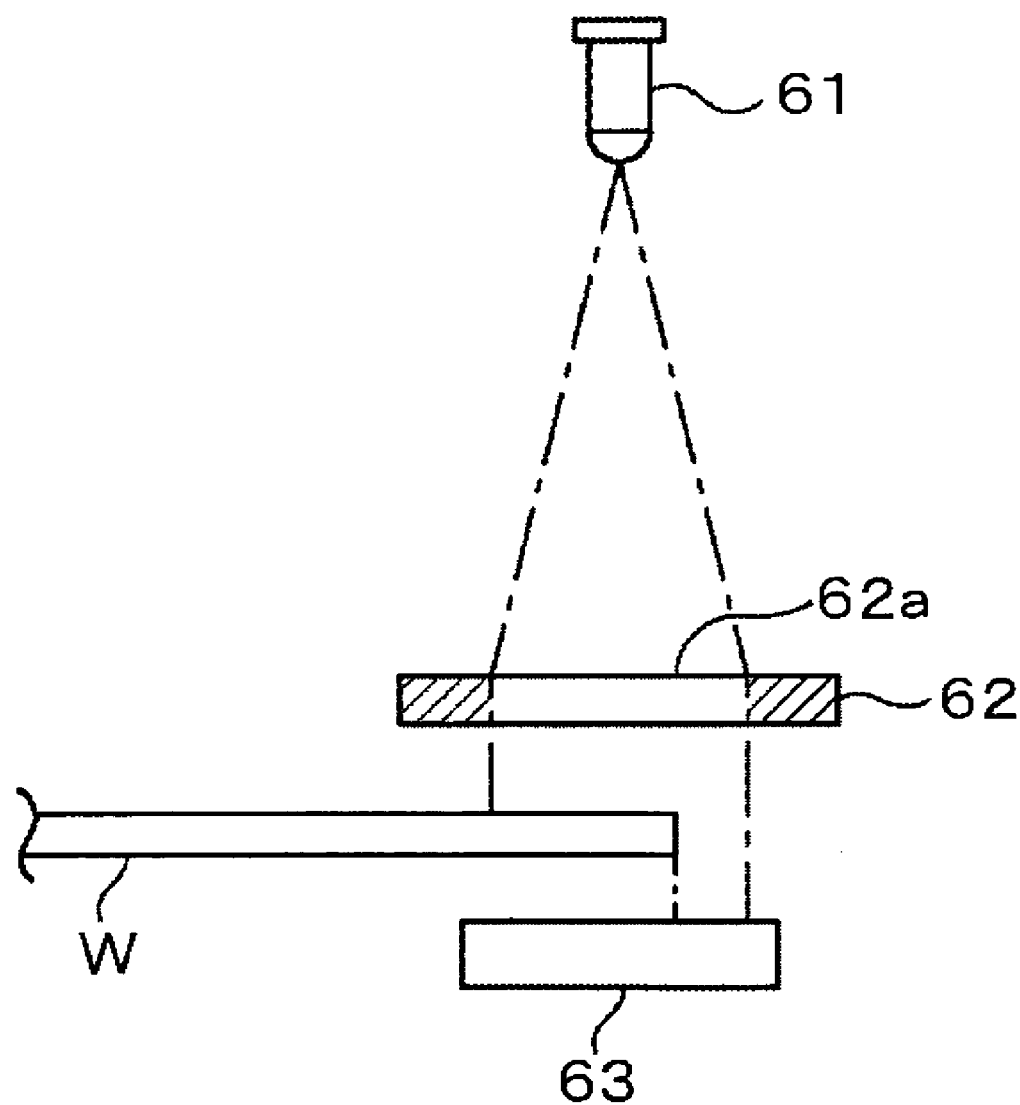
FIG. 4 is an explanatory view of an alignment unit constituting the edge exposure apparatus in FIG. 1.

Subsequently, to describe the alignment unit 6, the alignment unit 6 is provided by the side of the guide rail 32 in the casing 30 of each of the first and second exposure units 3A and 3B and composed of an alignment light source 61, a light blocking plate 62 provided with a slit 62a, and a sensor 63. When the wafer W is carried to the exposure position via the stage 34, the light emitted from the alignment light source 61 and passing through the slit 62a is partly blocked off by the edge portion of the wafer W. The beams of light are shown by one-dotted chain lines in FIG. 4, in which the light passes through the side of the wafer W without being blocked off by the wafer W is applied to the sensor 63. Based on the change of the application region sensed by the sensor 63 when the wafer W is rotated via the stage 34 or 35, a later-described controller detects the center position of the wafer W, the misalignment amount between the center position of the wafer W and the center of the stage 34 or 35, and the orientation of the notch N. After the stage 34 or 35 rotates to direct the notch N in a predetermined direction, for example, the stage 34 or 35 moves along the guide rail 32 based on the center position. Exposure beams can then be applied to an application region 40 of the wafer W while the stage 34 or 35 is rotating as described later to expose, for example, the edge of the wafer W in a uniform width.

Figure 6A:
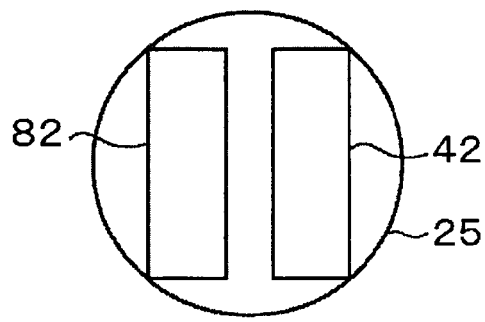
FIG. 6A is an explanatory view showing the positional relation between an application region of light beams and incident surfaces of light guide rods.
Figure 6B:
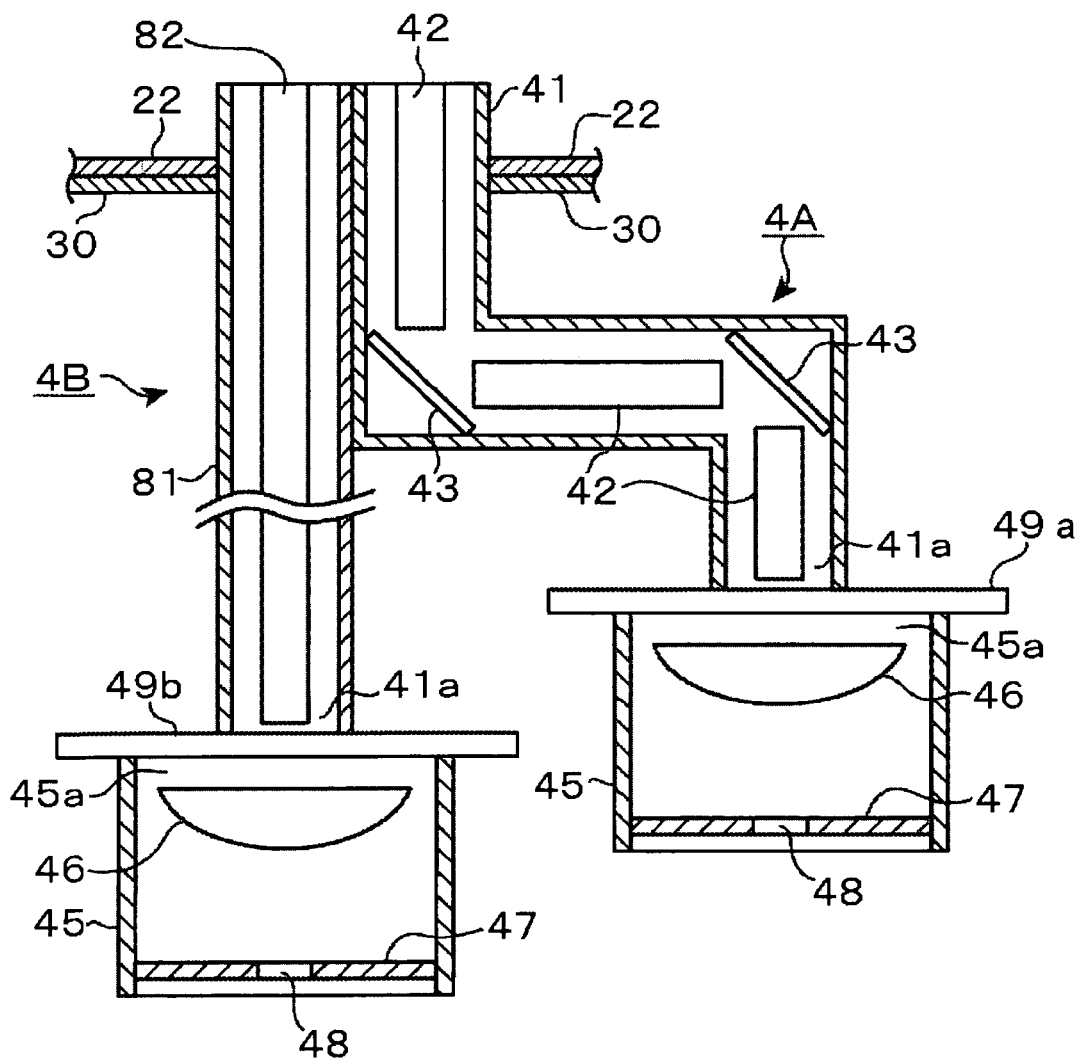
FIG. 6B is an explanatory view showing a configuration of optical path forming units provided in the edge exposure apparatus in FIG. 1.
Figure 7:
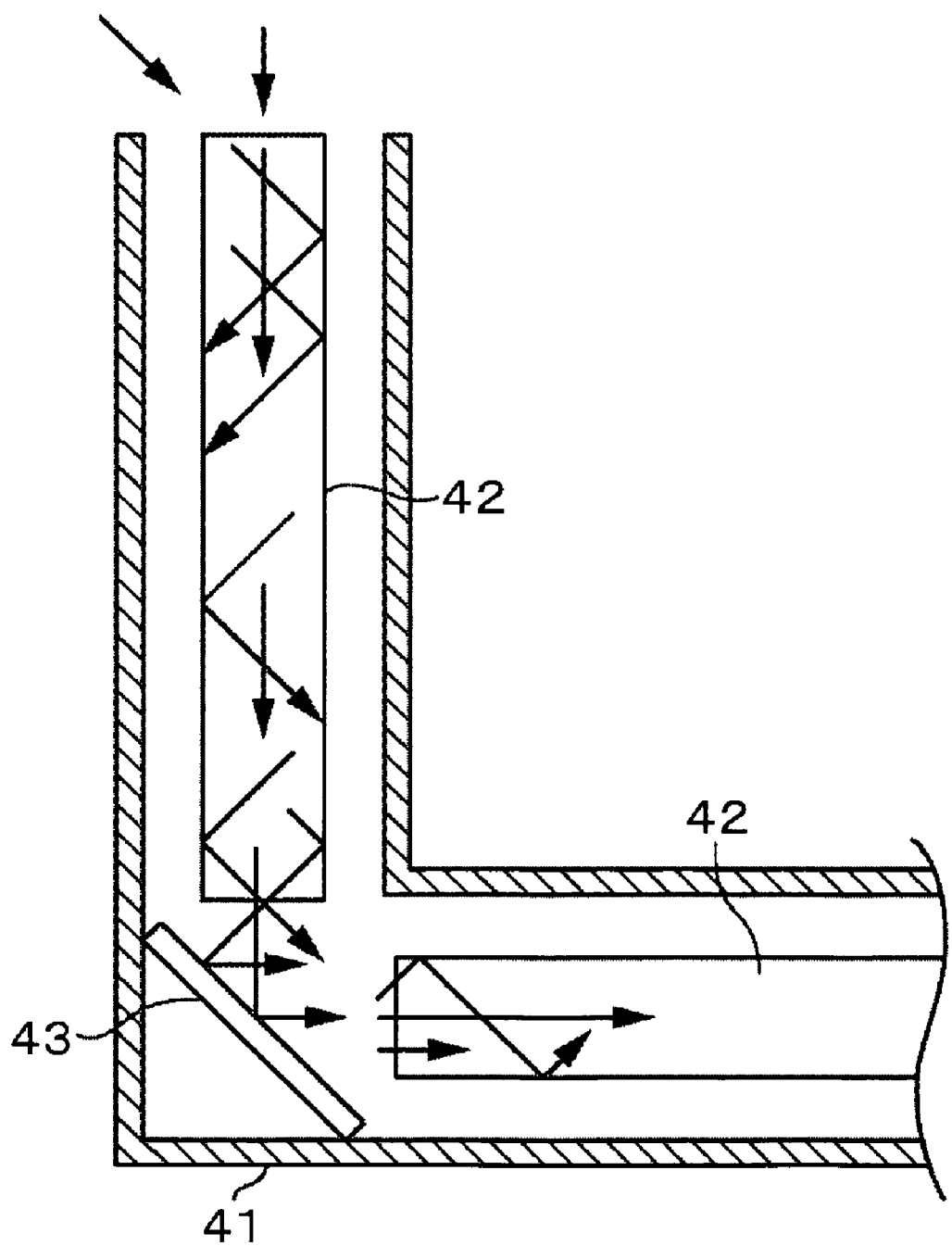
FIG. 7 is an explanatory view showing advancement of light in the light guide rod provided in the optical path forming unit in FIGS. 6A and 6B.

Subsequently, the first and second optical path forming units 4A and 4B will be described using FIG. 5 to FIG. 7. The first optical path forming unit 4A comprises an external pipe 41 having a structure bent at a right angle twice, for example, inward and outward, and the external pipe 41 extends at the base end side, that is, the inlet side, toward the inside of the casing 22 of the light source unit 21 and opens toward the light source 23. Further, the external pipe 41 extends at the tip end side, for example, in the vertical direction on the rear side in the casing 30 of the first exposure unit 3A. In the external pipe 41, a first light guide rod 42, for example, in a square shape being an optical path forming member is provided along the extending direction of the external pipe 41 and is divided into three portions such as a vertical portion, a horizontal portion, and a vertical portion to bend the optical path in this embodiment. The side peripheral surface of the first light guide rod 42 except, for example, the incident surface (an incident region) and an emitting surface (an emitting region) is formed of a reflecting film and plated with chrome in this embodiment. When light beams are made incident on the incident surface, the light beams advance in the first light guide rod 42 toward the emitting surface while being reflected every time they collides against the side peripheral surface as shown by arrows in FIG. 7 so that diffusion of the light from the side peripheral surface can be suppressed, whereby the light having an intensity uniform within the emitting surface is emitted from the surface. Further, a mirror 43 is provided at the bent portion in the external pipe 41 to refract the light emitted from the first light guide rod 42 toward the incident surface of the first light guide rod 42 on the tip end side.

Under the external pipe 41, a cylindrical body 45 is provided with a space intervening therebetween with its opening 45a facing an opening 41a of the external pipe 41. In the cylindrical body 45, a condenser lens 46 which is an optical path forming member and a light blocking mask 47, for example, in a plate shape are provided in this order from the upper portion to the lower portion. The light blocking mask 47 is formed with a slit 48 opened, for example, in a rectangular shape to adjust the shape of an exposure pot. The optical path forming unit 4A comprises a shutter 49a corresponding to a first shutter made of a light blocking member, and the first shutter 49a is configured to be able to enter a space between the external pipe 41 and the cylindrical body 45 via a drive unit 49, for example, in a manner to cover the openings 41a and 45a.

Figure 5:
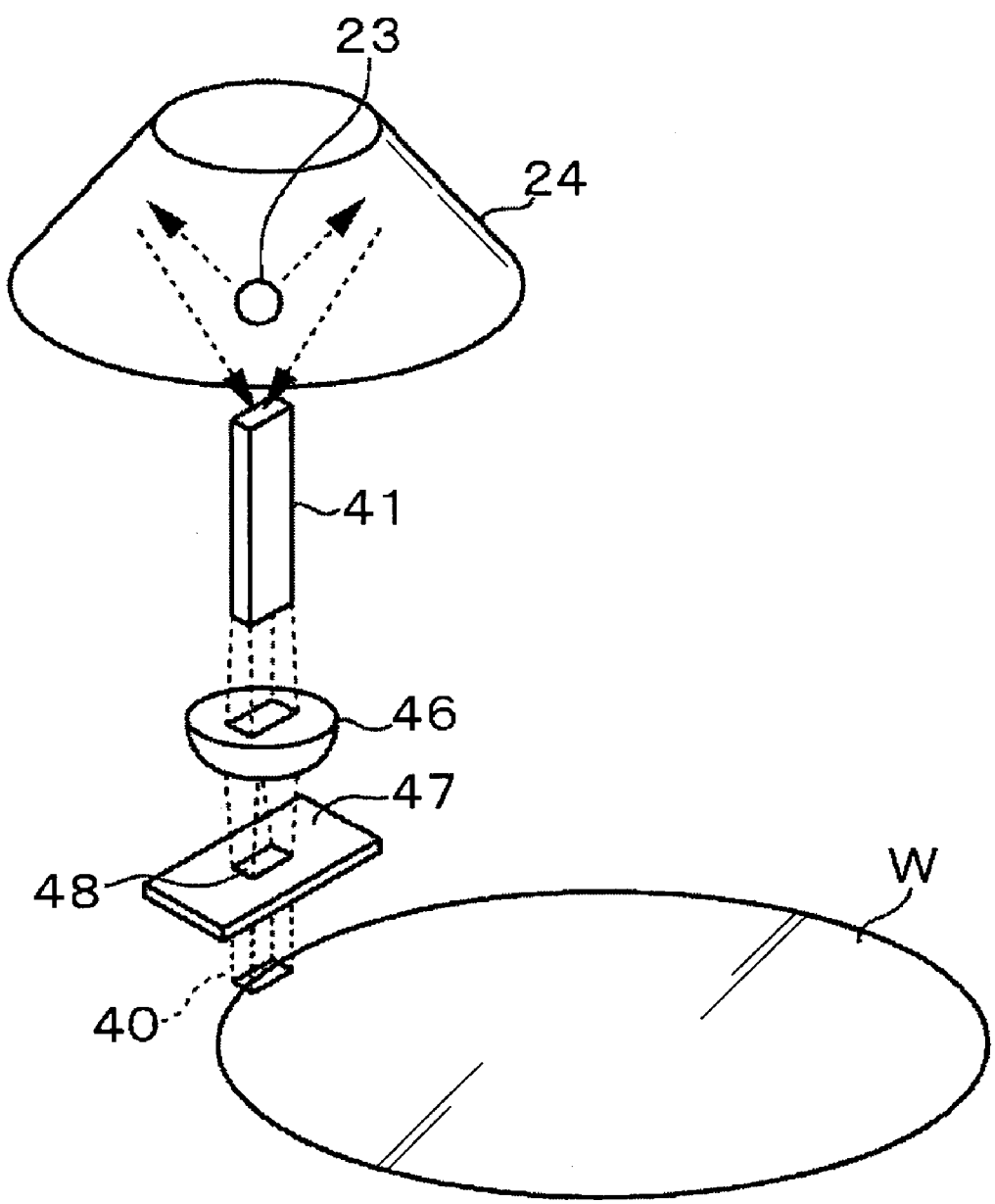
FIG. 5 is an explanatory view showing an optical path formed in the edge exposure apparatus in FIG. 1.

The first optical path forming unit 4A configured as described above ensures that, at the time when edge exposure is performed on the wafer W in the first exposure unit 3A, the light beams emitted from the light source 23 enter the portion of the first light guide rod 42 on the base end side, pass through all of the portions of the first light guide rod 42, and are applied from the emitting surface of the portion of the first light guide rod 42 on the tip end side onto the condenser lens 46, as schematically shown in FIG. 5. Note that the first light guide rod 42 is illustrated as one body with some of the divided portions thereof omitted to prevent the drawing in FIG. 5 from being complicated. The condenser lens 46 condenses the light beams toward and around the slit 48 so that the light beams passing through the slit 48 are applied to the application region 40 at the edge portion of the wafer W carried to the exposure position in the first exposure unit 3A, whereby edge exposure is performed. In this event, the edge exposure is performed, for example, in a manner that the light beams passing through the slit 48 partly pass the side of the wafer W.

If no edge exposure is performed, the first shutter 49a can enter the space between the cylindrical body 45 and the external pipe 41 to block the application of the light beams from the first light guide rod 42 to the condenser lens 46 to thereby block the application of the light beams to the wafer W.

Subsequently, the second optical path forming unit 4B will be described. The second optical path forming unit 4B has substantially the same configuration as that of the first optical path forming unit 4A, and therefore different portions will be mainly described. The second optical path forming unit 4B comprises an external pipe 81 extending, for example, in the vertical direction. The external pipe 81 is provided, for example, in a manner to penetrate the casing 30 of the first exposure unit 3A, and the external pipe 81 extends at the base end, that is, the inlet side, toward the inside of the casing 22 of the light source unit 21 and extends at the tip end side, for example, in the vertical direction toward the rear side of the casing 30 of the second exposure unit 3B. In the external pipe 81, the second light guide rod 82, for example, in a square shape being one optical path forming member is provided along the external pipe 81, and is configured similarly to the first light guide rod 42. The second optical path forming unit 4B comprises a cylindrical body 45 in which a condenser lens 46 and a light blocking mask 47 are arranged similarly to the optical path forming unit 4A in the casing 30 of the second exposure unit 3B. The cylindrical body 45 is provided with a space intervening between the cylindrical body 45 and the external pipe 81 and with an opening 81a of the external pipe 81 and an opening 45a of the cylindrical body 45 facing each other. Excepting the above-described differences, the second optical path forming unit 4B is configured similarly to the first optical path forming unit 4A, in which the light beams emitted from the second light guide rod 82 of the external pipe 81 are applied onto the condenser lens 46 of the cylindrical body 45, and the cylindrical body 45 condenses the light toward and around the slit 48. The light beams passing through the slit 48 are applied to the application region 40 at the edge portion of the wafer W carried to the exposure position via the second stage 35 in the second exposure unit 3B. As in the first optical path forming unit 4A, a shutter 49b being a second shutter can enter the space between the cylindrical body 45 and the external pipe 81 via the drive unit 49 to block the emission of the light beams from the external pipe 81 to the cylindrical body 45 to thereby block the application of the light beams to the edge portion of the wafer W at the exposure position.

The base end portion of the external pipe 81 is provided, for example, adjacent to the base end portion of the external pipe 41. The base end portions are provided as shown in FIG. 6A such that the light incident surface of the first light guide rod 42 on the base end side and the light incident surface of the second light guide rod 82 on the base end side are included within an application region of light beams (a beam spot) 25 shown in this drawing, in other words, both incident surfaces are included in the light beams when viewed in a cross-section of the light beams. Note that FIG. 6A schematically shows the positional relation between the application region 25 and the incident surfaces of the first and second light guide rods 42 and 82, in which the external pipes 41 and 81 are omitted.

The reason why the light guide rods 42 and 82 in a square shape are used is that in order to sequentially expose a ring-shaped region with a narrow width inside, for example, by 2 mm from the outer periphery of the wafer W, the square exposure spot offers better application efficiency than the circular exposure spot. Thus, the light guide rods 42 and 82 are square. The dimensions of each cross section of the light guide rods 42 and 82 are, for example, 10 mm×15 mm, and the shape of the cross section of the light beams from the light source 23 is a circle having a diameter of, for example, 30 mm.

The edge exposure apparatus 2 comprises a controller C. The controller C has a program storage unit composed of, for example, a computer, and the program storage unit stores a program composed, for example, of software incorporating instructions to implement later-described operation of the edge exposure apparatus 2, that is, processing of the wafer W, control of transferring the wafer W and so on. The controller controls the later-described operation of the edge exposure apparatus 2 by loading the program to the controller. The program is stored in the program storage unit with the program being recorded on a recording medium such as a hard disk, compact disk, magneto-optical disk, memory card or the like.

Figure 8A:
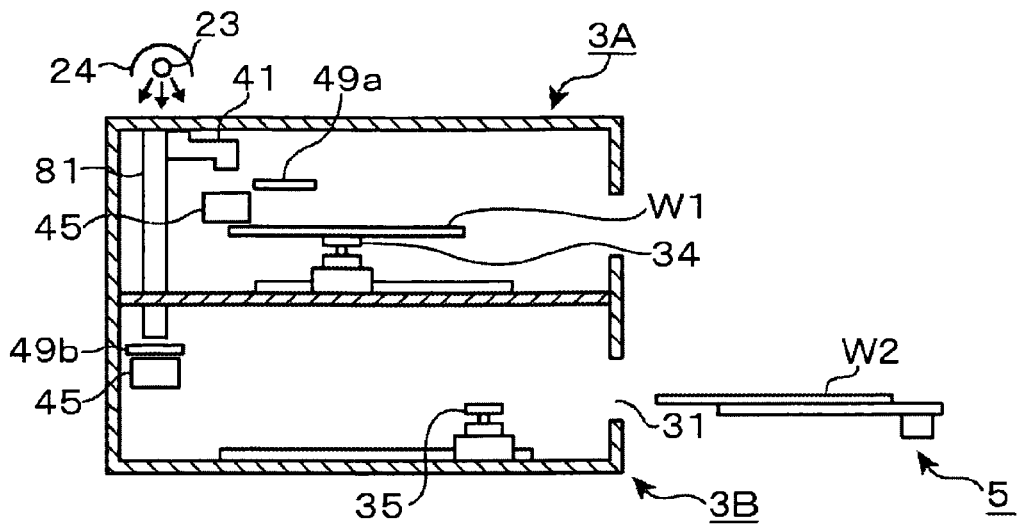
FIGS. 8A to 8C are a process chart showing one example of a procedure of performing edge exposure using the edge exposure apparatus in FIG. 1, FIG. 8A showing an appearance in which edge exposure processing is being performed only in a first exposure unit, FIG. 8B showing an appearance in which a wafer is being carried into a second exposure unit, and FIG. 8C showing an appearance after the wafer has been carried in the second exposure unit.
Figure 8B:
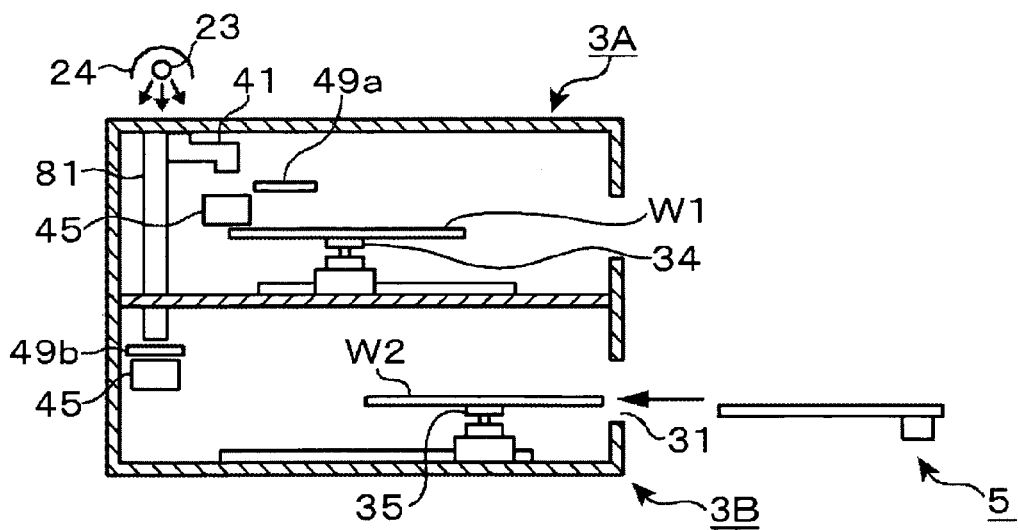
Figure 8C:
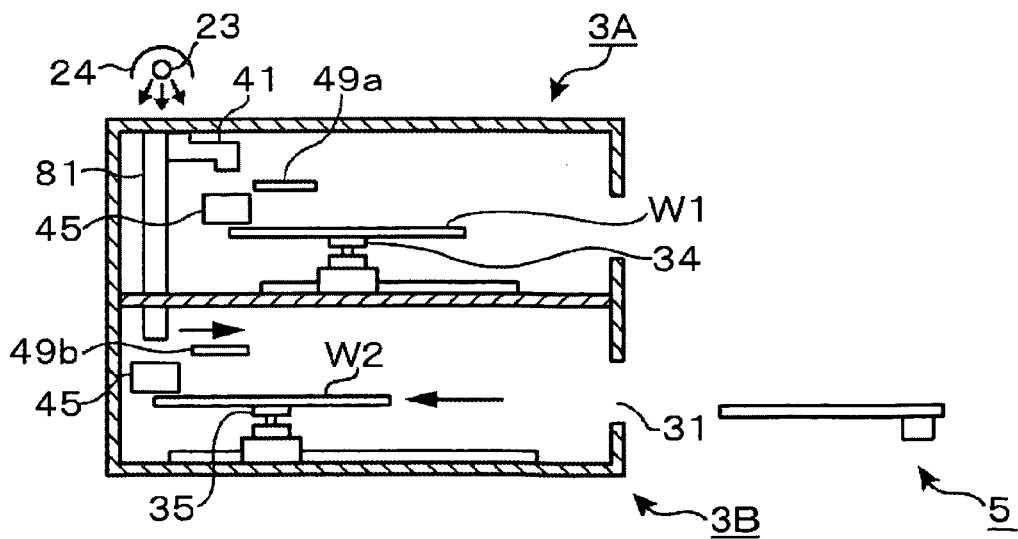

Next, the operation of the edge exposure apparatus 2 will be described with reference to FIGS. 8A to 8C and FIGS. 9A and 9B. It is assumed that, as shown in FIG. 8A, edge exposure processing of a wafer W1 is being performed now in the first exposure unit 3A, while a next wafer W2 is going to enter the second exposure unit 3B from the carry port 31 of the second exposure unit 3B by means of the carrier mechanism 5. The second stage 35 of the second exposure unit 3B has already moved to the transfer position, and the wafer W2 is transferred from the carrier mechanism 5 onto the second stage 35 and mounted thereon (FIG. 8B). The second stage 35 holds and carries the wafer W2 to the exposure position, and rotates at the exposure position as described above so that the notch N and the center position of the wafer W are detected via the alignment unit 6. The shutter 49b then retracts from the space between the external pipe 41 and the cylindrical body 45 (FIG. 8C).

As described above, the light beams from the light source unit 21 are divided to right and left sides into the first light guide rod 42 and the second light guide rod 82 and led down to the lower end of the external pipe 81, so that opening the shutter 49b allows the light beams to be condensed by the condenser lens 46 in the cylindrical body 45 thereunder and applied to the edge portion of the wafer W2. More specifically, the light beams are intermittently applied to the edge portion of the wafer w2, while the wafer W2 is intermittently rotated in response to the ON and OFF of the light beams. To make a schematic description here, in the case where exposure is performed, for example, for the entire circumference of the wafer W2 in the ring width by one pulse (light pulse), it is only required to rotate the wafer W2 if the center of the wafer W2 is aligned with the rotation center, but if there is misalignment therebetween, the second stage 35 moves laterally in FIG. 8C to correct the misalignment. In other words, if the distance between the outer line of the wafer W2 within the application region of the light beams and the rotation center is larger than the radius of the wafer W2, the second stage 35 moves to the right in FIG. 8C to correct only the larger amount (an amount of a portion protruding from the contour of the wafer W2 in the state where the rotation center and the center of the wafer W2 align with each other). Thus, the wafer W2 is rotated while the misalignment amount of the center is being corrected for each rotation position by the second stage 35 linearly moving based on previous alignment data, and the light pulses are injected into the entire circumference of the wafer W2. The cases of the edge exposure include exposure in a ring shape over the entire circumference of the wafer W, exposure in a stepped shape on the inner side corresponding to the formation region for a group of IC chips on the wafer W, and exposure of a part of the circumference rather than the entire circumference of the wafer W. It is also adoptable to include a step of linearly moving the first and second stages 34 and 35 for linear exposure in addition to the edge exposure of the wafer W. This linear exposure is performed to expose, for example, an identification code which has been formed on the front surface of the wafer W.

Figure 9A:
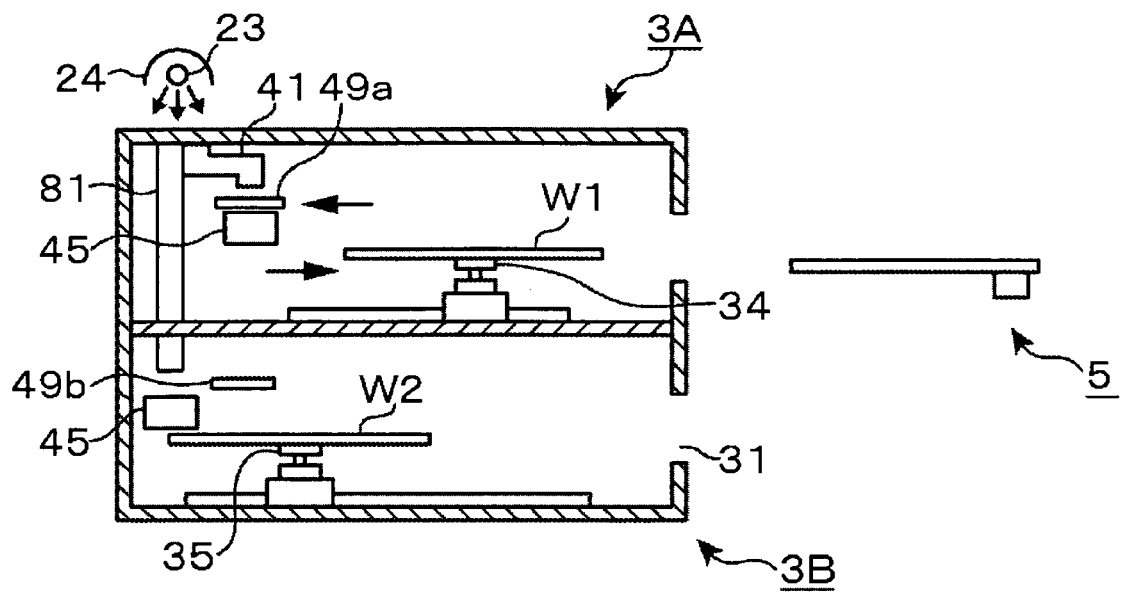
FIGS. 9A and 9B are a process chart showing one example of a procedure of performing edge exposure using the edge exposure apparatus in FIG. 1, FIG. 9A showing an appearance before the wafer for which the edge exposure processing has been finished only in the first exposure unit during the time when the edge exposure processing is being performed in the second exposure unit is taken out of the first exposure unit, and FIG. 9B showing an appearance after the wafer for which the edge exposure has been finished only in the first exposure unit during the time when the edge exposure processing is being performed in the second exposure unit is taken out of the first exposure unit.
Figure 9B:
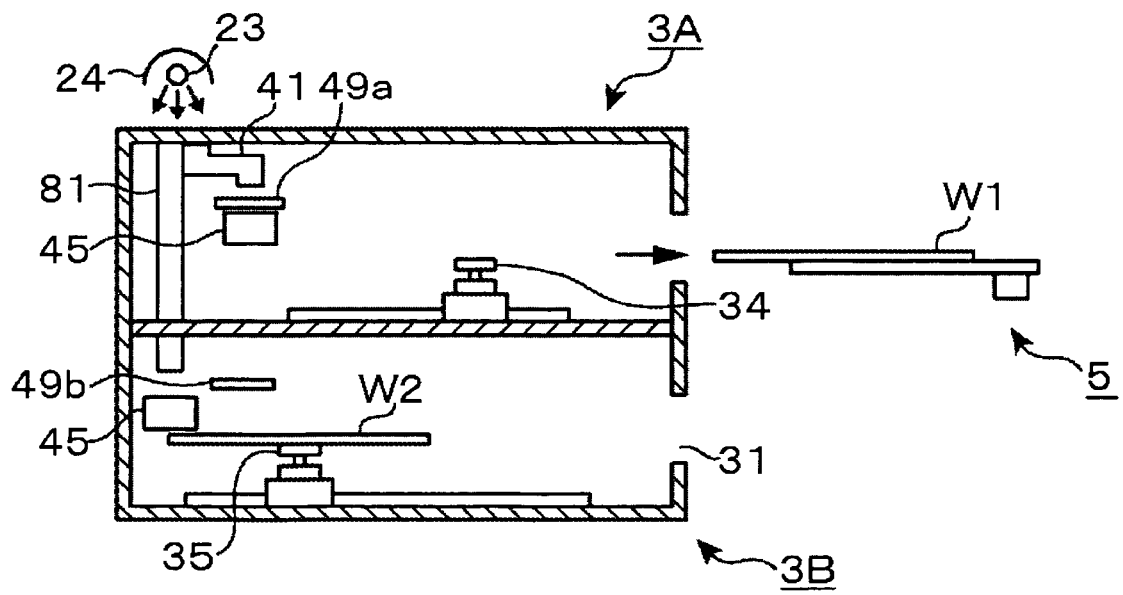

After predetermined edge exposure processing is finished in the first exposure unit 3A, for example, after the entire edge of the wafer W1 has been exposed during the edge exposure processing being continued in the second exposure unit 3B, the shutter 49a enters the space between the external pipe 41 and the cylindrical body 45 as shown in FIG. 9A to block the supply of the exposure beams to the wafer W1 to thereby finish of the edge exposure processing. When the edge exposure processing is finished, the stage 34 of the first exposure unit 3A carries the wafer W1 to the transfer position, and the carrier mechanism 5 enters the casing 30 so that the carrier arm 51 scoops the wafer W1 from the stage 34 to hold the rear surface of the wafer W1 and retracts to the outside of the casing 30 of the first exposure unit 3A (FIG. 9B). Thereafter, the carrier mechanism 5 carries a next wafer W to the first exposure unit 3A, and the wafer W is carried to the exposure position where the notch N and the center position of the wafer W are detected, and subjected to edge exposure processing similarly to the previous wafer W1.

According to the edge exposure apparatus 2, the base ends, that is, the inlets of the first light guide rod 42 and the second light guide rod 82 are located within the application region of the light beams when viewed in a cross section of the light beams from the light source 23, so that the one light source 23 can be used to perform edge exposure on the wafer W mounted on the first stage 34 of the first exposure unit 3A and the wafer W mounted on the second stage 35 of the second exposure unit 3B, for example, at the same time. Therefore, the edge exposure apparatus 2 can have high processing ability without increasing in size. To efficiently expose the edge of the wafer W, the edge exposure apparatus 2 comprises the first and second light guide rods 42 and 82 in a square shape as optical path forming members respectively. The first and second light guide rods 42 and 82 are provided such that the light incident surface of the first light guide rod 42 on the base end side and the light incident surface of the second light guide rod 82 on the base end side are included within the application region 25 of the light beams applied from the light source 23, namely, the light incident surface of the first light guide rod 42 and the light incident surface of the second light guide rod 82 are included within the light beams when viewed in the cross section of the light beams, whereby an unnecessary region of the light beams can be reduced, resulting in saving of energy. Further, since the first and second exposure units 3A and 3B are provided stacked one on the other, the installation space can be reduced.

Figure 10A:
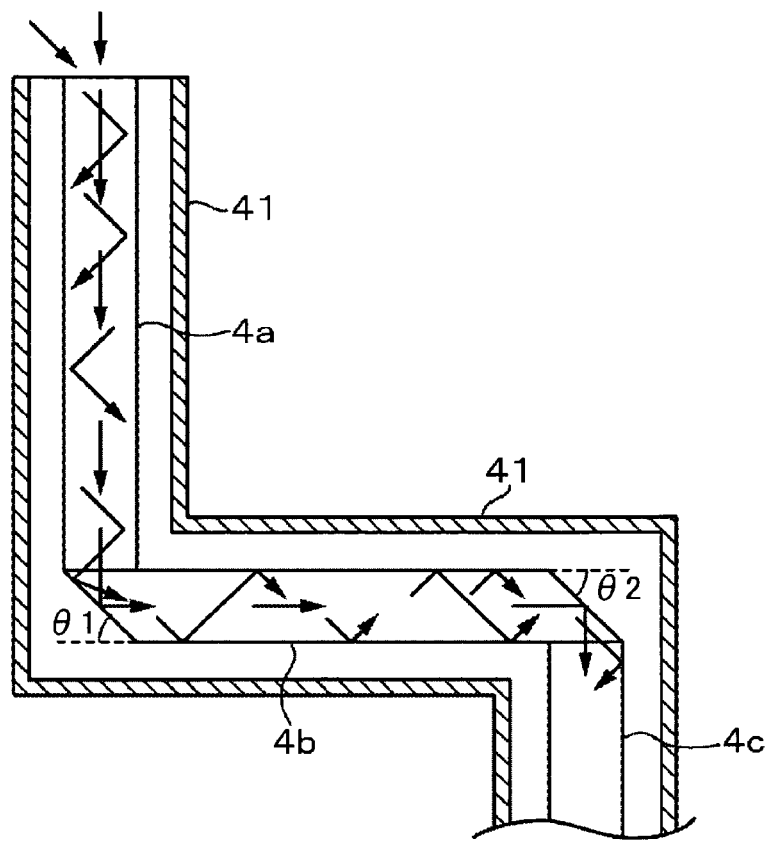
FIG. 10A is a longitudinal side view showing one example of another configuration of the optical path forming unit.

In the above-described embodiment, the first optical path forming unit 4A is not limited to the above-described configuration, but may have a configuration, for example, as shown in FIG. 10A. In this example, light guide rods 4a, 4b, and 4c are provided in the external pipe 41 from the base end side to the tip end side along the extending direction of the external pipe 41, in which the light guide rods 4a and 4c are formed similarly to the above-described light guide rod 42 and thus extend in the vertical direction. The light guide rod 4b is configured almost similarly to the light guide rod 42, but the light guide rod 4b extends on the base end side to a position below the light beam emitting surface of the light guide rod 4a and extends on the tip end side to a position above the light beam incident surface of the light guide rod 4c. The surface of the light guide rod 4b is plated with chrome excepting a portion facing the light beam emitting surface of the light guide rod 4a and a portion facing the light beam incident surface of the light guide rod 4c, and the base end surface and the tip end surface of the light guide rod 4b are formed diagonally with respect to the side peripheral surface of the light guide rod 4b. This configuration ensures that the light beams incident from the light guide rod 4a to the light guide rod 4b are reflected by the base end surface of the light guide rod 4b and advance in the light guide rod 4b toward the tip end surface, and the light beams are then reflected by the tip end surface of the light guide rod 4b and incident to the light guide rod 4c. Note that in this embodiment, an angle θ1 formed between the base end surface of the light guide rod 4b and the side peripheral surface of the light guide rod 4b and an angle θ2 formed between the tip end surface of the light guide rod 4b and the side peripheral surface of the light guide rod 4b are 45° respectively.

Figure 10B:
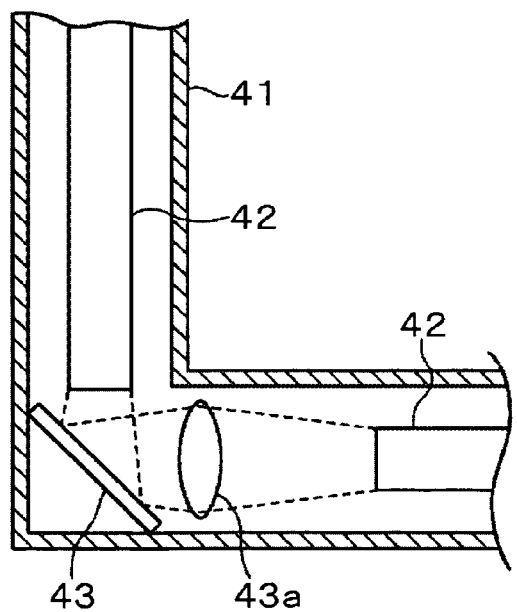
FIG. 10B is a longitudinal side view showing one example the optical path forming unit having a condenser lens.

Further, as another configuration of the first optical path forming unit 4A, a lens 43a may be provided on the tip end side of the mirror 43 in the external pipe 41 of the embodiment described first, so that when the light beams emitted from the portion of the light guide rod 42 on the base end side are refracted by the mirror 43 and applied to the lend 43a as shown in FIG. 10B, the condenser lens 43a applies the light beams toward to the incident surface of the portion of the light guide rod 42 on the tip end side.

It should be noted that the light guide member for supplying the light emitted from the light source 23 to the condenser lens 46 is not limited to the above-described light guide rods 42 and 82, but may employ, for example, an optical fiber.

The configuration of the present invention is not limited to the one shown by the edge exposure apparatus 2, but may be made such that, for example, three or more sets of exposure units and optical path forming units may be provided respectively in which light beams are independently supplied to the application region 40 of the wafer W in each of the exposure units.

Figure 11:
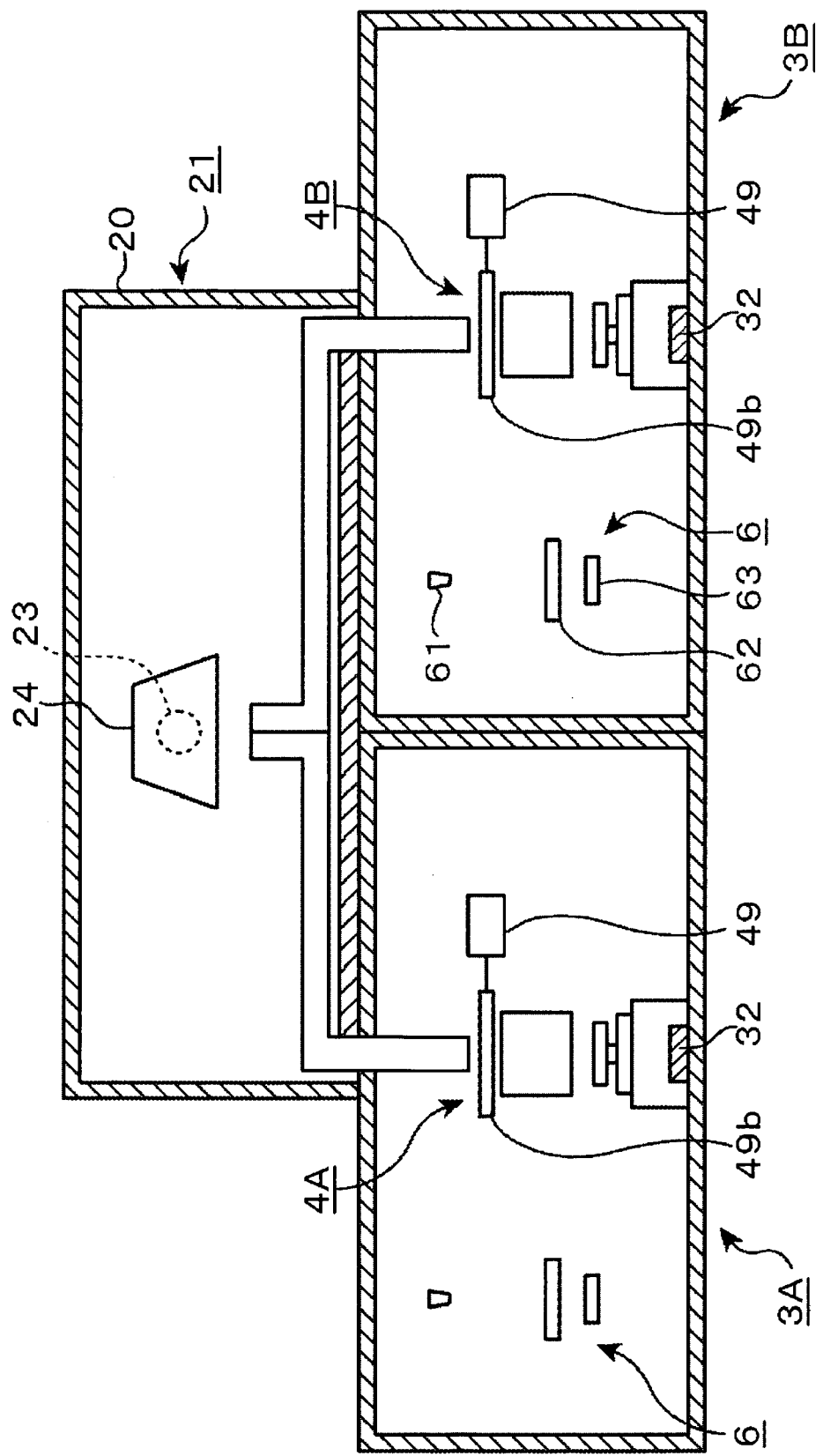
FIG. 11 is a cross-sectional view showing an embodiment of another edge exposure apparatus of the present invention.

Further, the edge exposure apparatus may be configured such that the first and second exposure units 3A and 3B are arranged in the horizontal direction as shown in FIG. 11. The configurations of the units in the edge exposure apparatus shown in this drawing are substantially the same as those of the units in the above-described edge exposure apparatus 2, excepting that the external pipes forming the first optical path forming unit and the second optical path forming unit are bent to be able to supply the light beams emitted from the light source unit 21 to the condenser lens 64. Each of the external pipes has a structure in which the above-described first light guide rod 42 and mirror 43 being light guide members are arranged as in the external pipe 41 of the optical path forming unit 4A of the edge exposure apparatus 2.

Figure 12A:
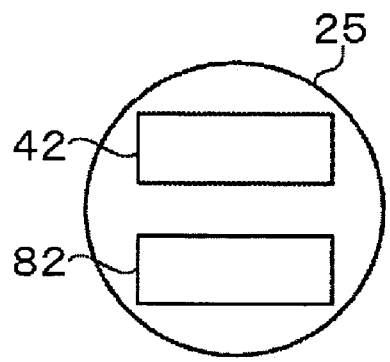
FIGS. 12A to 12C are explanatory views showing positional relations between the application region and the incident surfaces of the light guide rods in an embodiment of another edge exposure apparatus of the present invention, FIG. 12A showing an appearance in which the incident surfaces of the two light guide rods are included within the application region, FIG. 12B showing an appearance when edge exposure is performed only in the first exposure unit, and FIG. 12C showing an appearance when edge exposure is performed only in the second exposure unit.
Figure 12B:
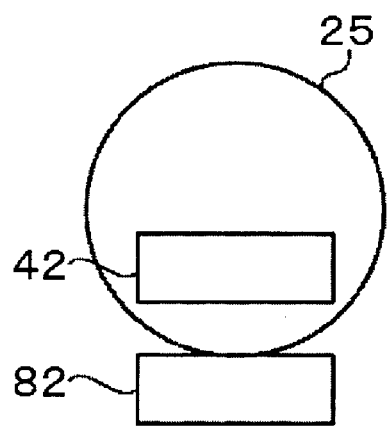
Figure 12C:
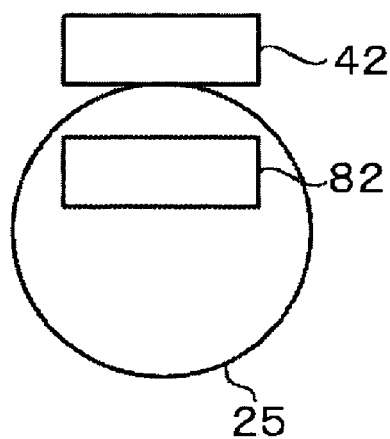

Incidentally, in the edge exposure apparatus 2, it is only required to supply/shut off the light beams emitted from the light source 23 to/from the application region of the wafer W in the first exposure unit 3A and the second exposure unit 3B through use of a light blocking means, which light blocking means is not limited one having the configuration in which the optical paths are blocked by the above-described first and second shutters 49a and 49b. More specifically, in place of provision of the first and second shutters 49a and 49b, a mechanism for relatively moving the light beam (application region) 25 from the light source 23 and the light guide rods 42 and 82 in a direction intersecting with the light beams, for example, a direction perpendicular thereto may be provided in the above-described edge exposure apparatus 2 so that when edge exposure is performed in the first exposure unit 3A and the second exposure unit 3B, the incident surfaces of the light guide rods 42 and 82 are included within the application region 25 as shown in FIG. 12A; when edge exposure is performed only in the first exposure unit 3A, only the incident surface of the first light guide rod 42 is included within the application region 25 as shown in FIG. 12B; and when edge exposure is performed only in the second exposure unit 3B, only the incident surface of the second light guide rod 82 is included within the application region 25 as shown in FIG. 12C. To realize the above configuration, the reflector 24 and the light source 23 can be moved by the drive motor 24a, for example, as shown in FIG. 2. By moving the reflector 24 and the light source 23 in the direction in which the first and second optical path forming units 4A and 4B are arranged side by side, the states shown in FIG. 12A, FIG. 12B, and FIG. 12C can be realized.

Figure 13A:
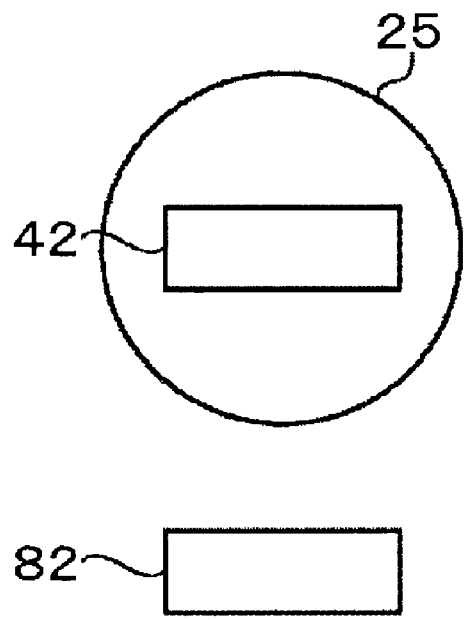
FIGS. 13A and 13B are explanatory views showing positional relations between the application region and the incident surfaces of the light guide rods in an embodiment of another edge exposure apparatus of the present invention, FIG. 13A showing an appearance when edge exposure is performed only in the first exposure unit, and FIG. 13B showing an appearance when edge exposure is performed only in the second exposure unit.
Figure 13B:
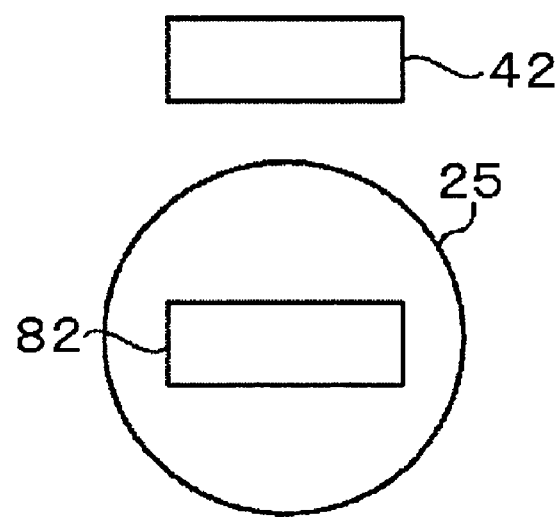

Further, a mechanism for relatively moving the light beams from the light source 23 and the light guide rods 42 and 82 in a direction intersecting with the light beams, for example, a direction perpendicular thereto may be provided so that the light beams are applied to one of the light guide rods 42 and 82. More specifically, it is also adoptable to configured such that, as shown in FIGS. 13A and 13B, the incident surface of the light guide rod 42 and the incident surface of the light guide rod 82 never be included within the application region 25 at the same time, but either one of them is included within the application region 25. This configuration can be realized by controlling the space between the first and second optical path forming units 4A and 4B and the moving amount of the reflector 24 and the light source 23. In such configuration, edge exposure cannot be performed on the wafers W at the same time in the first exposure unit 3A and the second exposure unit 3B, but during the time when the edge exposure is being performed in one of the exposure units, the wafer W can be carried into or carried out of the other exposure unit to thereby reduce the time of changing the wafer W for another W, resulting in increased ability of processing the wafer W. In addition, either one of the incident surfaces of the light guide rod 42 or the light guide rod 82 is located at the center of the application region 25 as shown in FIGS. 13A and 13B, whereby only a portion of the light with high intensity and uniformity can be introduced into the light guide rods for use in edge exposure processing.

Figure 14A:
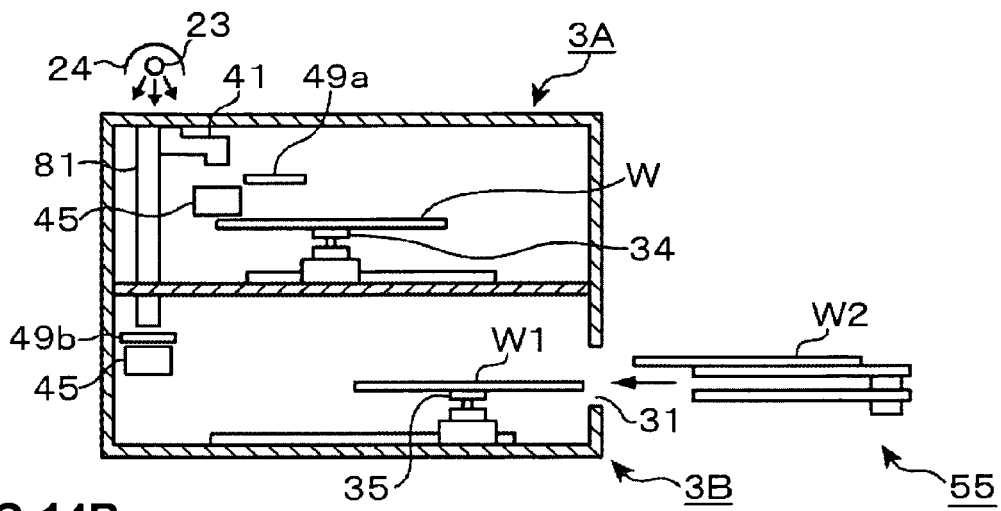
FIGS. 14A to 14C are a process chart showing one example of carriage of the wafer to/from the edge exposure apparatus of the present invention, FIG. 14A showing an appearance in which a carrier arm approaches the second exposure unit, FIG. 14B showing an appearance in which the carrier arm has received from the second exposure unit the wafer which has been subjected to edge exposure, and FIG. 14C showing an appearance in which the carrier arm has mounted an unprocessed wafer in the second exposure unit.
Figure 14B:
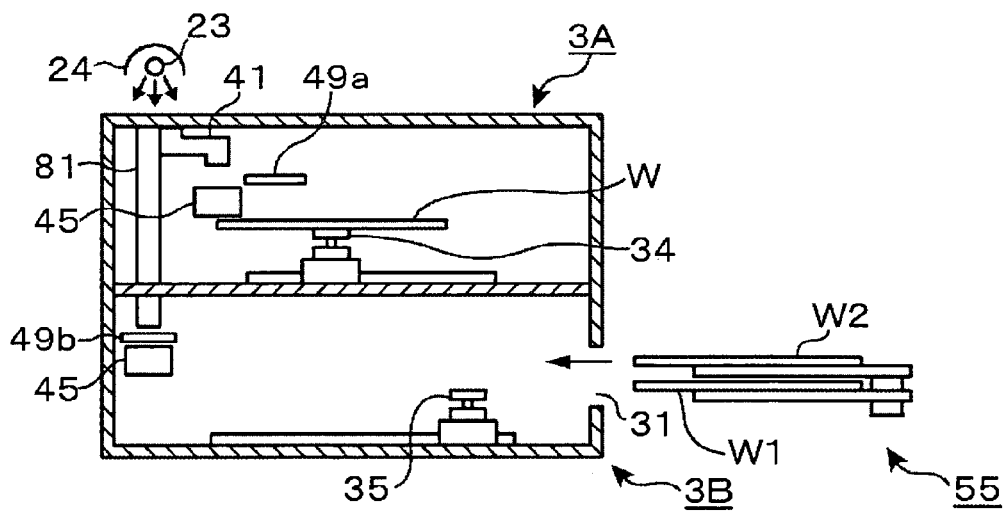
Figure 14C:
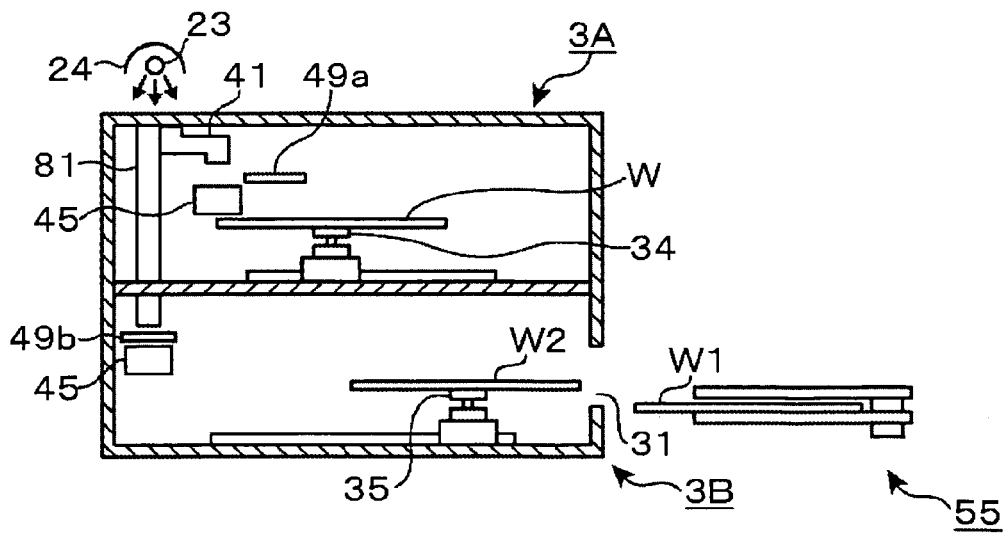

In the case where the wafer W is carried into the first exposure unit 3A or the second exposure unit 3B by a carrier mechanism 55 provided with two carrier arms which are configured to freely rise and lower, freely rotate about the vertical axis, and freely move back and forth independently, for example, via a carrier base, in place of the above-described carrier mechanism 5, the wafer W may be carried, for example, as shown in FIGS. 14A to 14C. To make a concrete description, the carrier mechanism 55 approaches the second exposure unit 3B with the wafer W2 being held by one of the carrier arms, and the carrier arm holding no wafer enters the second exposure unit 3B (FIG. 14) and receives the wafer W1 which has already been subjected to edge exposure from the stage 35 of the second exposure unit 3B which has moved to the transfer position (FIG. 14B). Subsequently, the carrier arm holding the wafer W2 enters the second exposure unit 3B and transfers the wafer W2 onto the stage 35 (FIG. 14C).

It is preferable that the optical lengths of the light guide rod 42 and the light guide rod 82 are set equal. More specifically, the optical length is indicated by path×refractive index, and therefore the optical lengths are set equal, whereby the light to be applied to the wafers W can be fixed in intensity, namely, uniform in quality.

Figure 15:
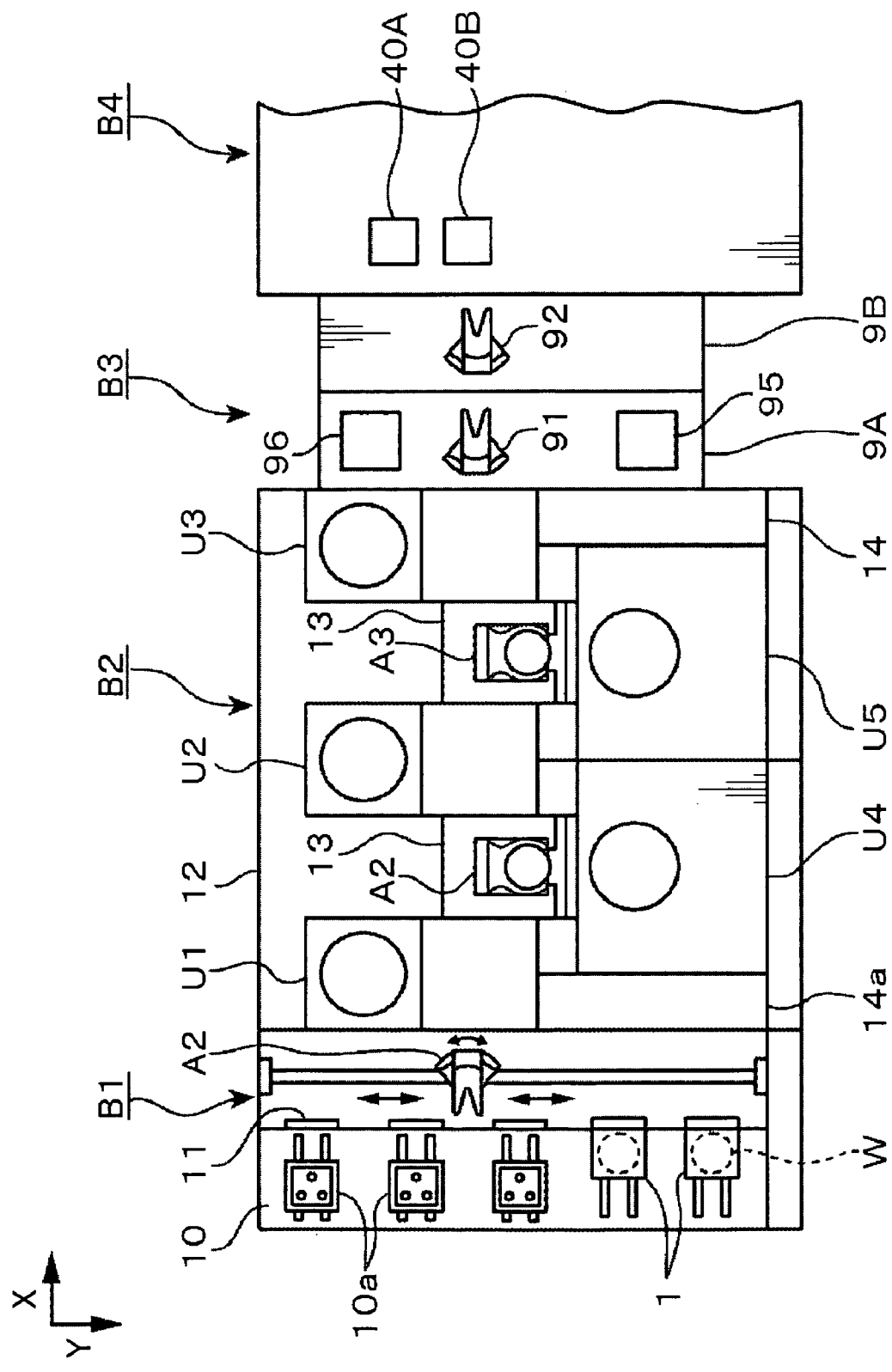
FIG. 15 is a plan view of a coating and developing apparatus in which the edge exposure apparatus in the first embodiment is employed.
Figure 16:
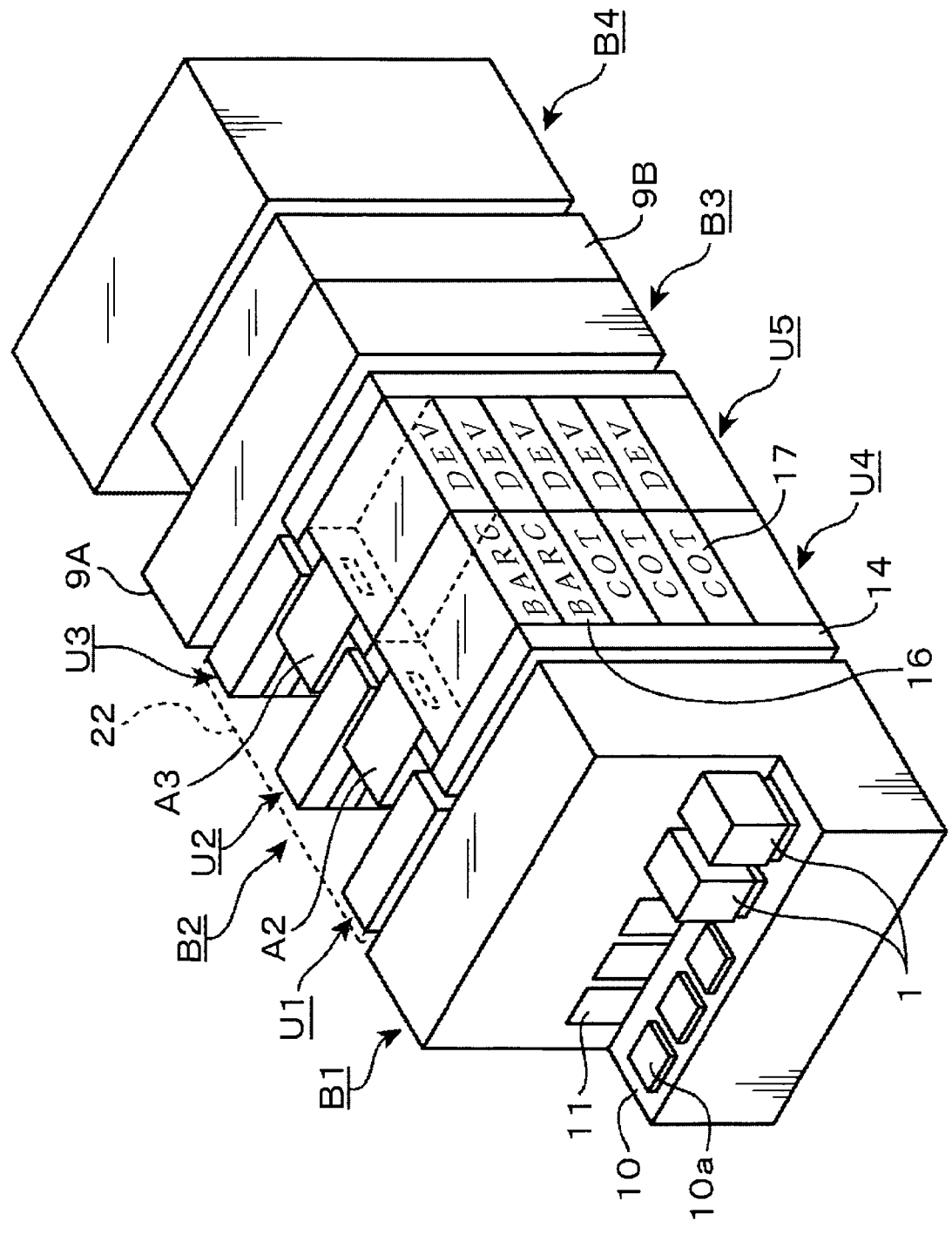
FIG. 16 is a perspective view showing the coating and developing apparatus in FIG. 15.

Next, an embodiment in which the above-described edge exposure apparatus 2 is applied to a coating and developing apparatus will be described. FIG. 15 is a plan view showing a resist pattern forming apparatus in which the coating and developing apparatus is connected to an aligner, and FIG. 16 is a perspective view thereof. In the drawings, B1 denotes a carrier mounting section for carrying-in/out carriers 1 each hermetically housing, for example, 13 wafers W, in which section a carrier station 10 having a mounting portions 10a capable of mounting a plurality of carriers 1 side by side thereon, opening/closing portions 11 provided on a wall surface ahead as viewed from the carrier station 10 side, and a transfer means A1 for taking the wafers W out of the carrier 1 through the opening/closing portion 11, are provided.

To the rear side of the carrier mounting section B1, a processing section (processing block) B2 whose periphery is surrounded by a casing 12 is connected, and in the processing section B2, three shelf units U1, U2, and U3, in each of which heating and cooling units are multi-tiered and main carrier means A2 and A3 for transferring the wafer W between units of solution treatment units U4 and U5 are alternately arranged in order from the front side. More specifically, the shelf units U1, U2, and U3 and the main carrier means A2 and A3 are arranged in a line in a depth direction as viewed from the carrier mounting section B1 side, and not-shown openings for carrying the wafer are formed at connecting portions of the units and means so that the wafer W can be freely moved from the shelf unit U1 at one end side to the shelf unit U3 at the other end side in the processing block B2. Further, each of the main carrier means A2 and A3 is placed in a space surrounded by a partition wall 13 composed of face portions on the side of the shelf units U1, U2, and U3 which are arranged in one line in a depth direction as viewed from the carrier mounting section B1, one face portion on the side of the later-described solution unit U4 or U5 on the right side, a rear face portion forming one face on the left side. Numeral 14 in the drawing denotes a temperature and humidity regulating unit comprising a temperature regulator, a duct for regulating the temperature and humidity and so on for treatment solutions used in the units.

The shelf units U1, U2, and U3 are configured such that various kinds of units for performing pre-processing and post-processing of treatments performed in the solution treatment units U4 and U5 are multi-tiered, for example, ten-tiered, in which the combination of the units includes a heating unit (PAB) for heating (baking) the wafer W, a cooling unit for cooling the wafer W, and so on. The solution treatment units U4 and U5 are configured such that an antireflection film forming unit (BARC) 16, a resist coating unit (COT) 17, a developing unit (DEV) 18 for supplying a developing solution to the wafer W to perform developing treatment, and so on are multi-tiered, for example, five-tiered on a chemical storing section of the resist and the developing solution.

Figure 17:
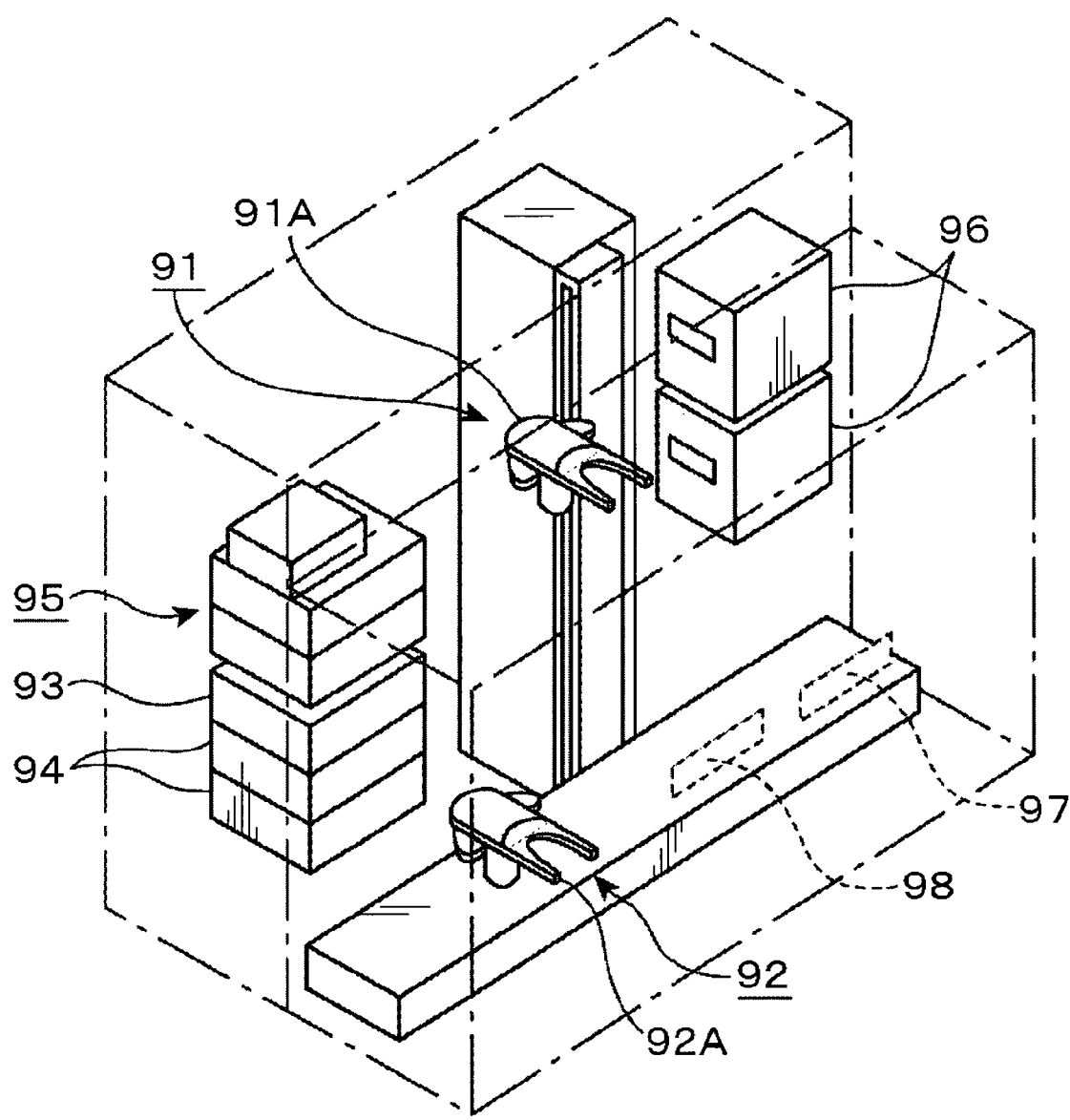
FIG. 17 is a perspective view of an interface section constituting the coating and developing apparatus in FIG. 15.

To the rear side of the shelf unit U3 in the processing section B2, an aligner section B4 is connected via an interface section (interface block) B3. The interface section B3 is provided between the processing section B2 and the aligner section B4 in the depth direction, and composed of a carrier chamber 9A and a carrier chamber 9B each of which is surrounded by a casing. To make a description with reference to FIG. 17, a carrier mechanism 91 provided with a carrier arm 91A which can freely rise and lower, freely rotate about the vertical axis, and freely move back and forth, is provided at the central potion of the carrier chamber 9A. The carrier mechanism 91 is configured to be able to access a later-described transfer unit (TRS) 93, high-precision temperature regulating unit 94, edge exposure unit 95, buffer cassette 96 and the shelf unit U3 provided in the processing block B2 so as to transfer the wafer W to/from each of the units.

On the right side of the carrier mechanism 91 as viewed from the carrier mounting section B1 side, the transfer unit (TRS) 93 and two high-precision temperature regulating units 94 each having a cooling plate are stacked, for example, one on the other. Above the above-described TRS 93, the edge exposure unit 95 is further provided which corresponds to the above-described edge exposure apparatus 2. On the other hand, on the left side of the carrier mechanism 91 as viewed from the carrier mounting section B1 side, two buffer cassettes 96 each for temporarily housing a plurality of, for example, 13 wafers W are provided, for example, contiguously one on the other.

In the carrier chamber 9B, a carrier mechanism 92 provided with a carrier arm 92A which can freely rise and lower, freely rotate about the vertical axis, and freely move back and forth, is provided. A not-shown carry port, for example, is provided in the side wall of the casing of the carrier chamber 9B facing the carrier chamber 9A so that the wafer W can be transferred between the carrier mechanisms 91 and 92 via the carry port. Further a carry port 97 and a carry port 98 are provided in the side wall of the casing of the carrier chamber 9B facing the aligner B4. In the aligner B4, a stage 40A for receiving the wafer W from the interface section B3 and a stage 40B for transferring the wafer W after exposure to the interface section B3 are provided so that the wafer W is transferred between the stage 40A and the carrier mechanism 92 via the carry port 97 and the wafer W is transferred between the stage 40B and the carrier mechanism 92 via the carry port 98.

Next, the operation of the above-described embodiments will be described. After the cassette C housing the wafers W from the outside is mounted on the mounting portion 10a, a lid of the hermetically sealed cassette C is removed together with the opening/closing portion 11 and the wafer W is taken out first by the transfer means A1. Subsequently, the wafer W is transferred to the main carrier means A2 via the transfer unit (TRS1) forming one tier of the first shelf unit U1, and formation of an antireflection film that is a film for preventing reflection of light at exposure of the wafer W on the front surface of the wafer W is performed in one shelf in the shelf units U1 to U3, for example, in the antireflection film forming unit 16 as the pre-processing of the coating treatment. Subsequently, the wafer W is coated with a resist solution in the coating unit 17 so that a resist film is formed thereon.

The wafer W having the solution film of resist formed thereon is subjected to a predetermined first heating processing at a temperature, for example, around 100° C. in the heating unit (PAB) forming one shelf of the shelf units U1 to U3, and then cooled to a predetermined temperature in the cooling unit (CPL2). The cooled wafer W is carried by the carrier mechanism 91 into the carrier chamber 9A and into the edge exposure unit 95 where the wafer W is subjected to edge exposure processing as described above. The wafer W which has been subjected to the edge exposure processing is carried by the carrier mechanism 91 to the high-precision temperature regulating unit 94 in which the temperature of the front surface of the wafer W is regulated precisely to a setting temperature corresponding to the temperature in the aligner B4. The carrier mechanism 91 transfers the temperature-regulated wafer W to the carrier mechanism 92, and the wafer W is thus carried into the carrier chamber 9B. The carrier mechanism 92 transfers the wafer W to the stage 40A in the aligner B4 via the carry port 97.

The wafer W for which exposure processing has been finished in the aligner B4 is mounted on the stage 40B and then carried into the carrier chamber 9B via the carrier mechanism 92. Subsequently, the wafer W is transferred between the carrier mechanism 92 and the carrier mechanism 91, and the carrier mechanism 91 carries the received wafer W to the second heating unit (PEB) included in the shelf unit U3 in the processing section B2.

To describe the carriage of the wafer W in the processing section B2, the wafer W is subjected to predetermined heating processing in the PEB and then cooled to a predetermined temperature in the cooling unit (CPL2). If the heating unit (PAB) comprises a cooling plate which horizontally moves, the wafer W is cooled by the cooling plate. The wafer W is then carried to the developing unit (DEV) where the wafer W is subjected to a predetermined developing treatment, and subsequently taken out by the main carrier means A3. The wafer W is thereafter carried by the main carrier means A2 and A3 to the heating unit (POST) where the wafer W is subjected to predetermined heating processing and then adjusted to a predetermined temperature in the cooling unit (CPL3). Thereafter, the wafer W is returned via the transfer unit TRS1 in the first shelf unit U1 to the original carrier 1 in the carrier mounting section B1.

As described above, the edge exposure apparatus of the present invention is employed as the edge exposure unit provided in the coating and developing apparatus to ensure that edge exposure can be performed, for example, at the same time as described above on two wafers W each having on its front surface a resist film formed in the processing block B2, without increasing the size of the interface section B3 in which the edge exposure apparatus is installed, resulting in increased throughput.

What is claimed is:

1. An edge exposure apparatus for exposing an edge portion of a substrate having a photosensitive thin film formed thereon by a light source for exposure, comprising:
   a first optical path forming member and a second optical path forming member with respective inlet sides arranged within light beams from said light source;
   a first mounting table configured to be rotatable about a vertical axis while mounting the substrate thereon, and provided such that the edge portion of the substrate is located within an application region of the light beams from an outlet side of said first optical path forming member;
   a second mounting table configured to be rotatable about a vertical axis while mounting the substrate thereon, and provided such that the edge portion of the substrate is located within an application region of the light beams from an outlet side of said second optical path forming member; and
   a light blocking means for blocking application of light from each of said first optical path forming member and said second optical path forming member,
   wherein said light blocking means has a first shutter for blocking an optical path formed by said first optical path forming member and a second shutter for blocking an optical path formed by said second optical path forming member,
   wherein each of said first optical path forming member and said second optical path forming member has a light guide rod and a lens for condensing light from said light guide rod, and
   wherein each of said first shutter and said second shutter is provided between said light guide rod and said lens.

2. The edge exposure apparatus as set forth in claim 1, wherein said light blocking means has means for relatively moving said first optical path forming member and second optical path forming member and said light source between a state where one of the inlet sides of said first optical path forming member and second optical path forming member is located within the light beams from said light source and the other is not located within the light beams, and a state where both of the inlet sides of said first optical path forming member and second optical path forming member are located within the light beams from said light source.

3. The edge exposure apparatus as set forth in claim 1, wherein said first mounting table and said second mounting table are placed one on the other.

4. The edge exposure apparatus as set forth in claim 1, wherein each of said first optical path forming member and said second optical path forming member includes a light guide rod in a square shape, and the inlet side of each of said optical path forming members is on a base end side of said light guide rod.

5. The edge exposure apparatus as set forth in claim 1, wherein each of said optical path forming members includes a light guide rod made by forming a reflecting film on a side peripheral surface of a quartz rod.

6. The edge exposure apparatus as set forth in claim 1, wherein optical path lengths of said first optical path forming member and said second optical path forming member are equal.

7. An edge exposure apparatus for exposing an edge portion of a substrate having a photosensitive thin film formed thereon by a light source for exposure, including:
   a first optical path forming member and a second optical path forming member receiving light beams from said light source incident on respective inlet sides thereof;
   means for relatively moving said light source and said first optical path forming member and second optical path forming member so that the light beams alternately pass through the inlet side of said first optical path forming member and the inlet side of said second optical path forming member;
   a first mounting table configured to be rotatable about a vertical axis while mounting the substrate thereon, and provided such that the edge portion of the substrate is located within an application region of the light beams from an outlet side of said first optical path forming member; and a second mounting table configured to be rotatable about a vertical axis while mounting the substrate thereon, and provided such that the edge portion of the substrate is located within an application region of the light beams from an outlet side of said second optical path forming member, wherein each of said first optical path forming member and said second optical path forming member includes a light guide rod in a square shape, and the inlet side of each of said optical path forming members is on a base end side of said light guide rod.

8. The edge exposure apparatus as set forth in claim 7, wherein said first mounting table and said second mounting table are placed one on the other.

9. The edge exposure apparatus as set forth in claim 7, wherein each of said optical path forming members includes a light guide rod made by forming a reflecting film a side peripheral surface of a quartz rod.

10. An edge exposure method of exposing an edge portion of a substrate having a photosensitive thin film formed thereon by a light source for exposure, comprising the steps of:

light beams from the light source being made incident on a first optical path forming member and a second optical path forming member with respective inlet sides arranged within the light beams;

mounting the substrate on a first mounting table and rotating the substrate about a vertical axis, and exposing the edge portion of the substrate to the light beams from an outlet side of the first optical path forming member;

blocking application of light from the second optical path forming member when exposure is being performed for the edge portion of the substrate on the first mounting table; and mounting the substrate on a second mounting table and rotating the substrate about a vertical axis, and releasing the block of the application of the light from the second optical path forming member to expose the edge portion of the substrate to the light beams from an outlet side of the second optical path forming member, wherein each of the first optical path forming member and the second optical path forming member includes a light guide rod in a square shape, and the inlet side of each of the optical path forming members is on a base end side of the light guide rod.

11. The edge exposure method as set forth in claim 10, wherein the first mounting table and the second mounting table are placed one on the other.

12. An edge exposure method of exposing an edge portion of a substrate having a photosensitive thin film formed thereon by a light source for exposure, comprising the steps of:

relatively moving the light source and a first optical path forming member so that light beams from the light source are located at a position passing through an inlet side of the first optical path forming member, rotating the substrate mounted on a first mounting table about a vertical axis, and exposing the edge portion of the substrate to the light beams from an outlet side of the first optical path forming member; and relatively moving the light source and the first optical path forming member and a second optical path forming member so that the light beams from the light source deviate from the inlet side of the first optical path forming member and are located at a position passing through an inlet side of the second optical path forming member, rotating the substrate mounted on a second mounting table about a vertical axis, and exposing the edge portion of the substrate to the light beams from an outlet side of the second optical path forming member, wherein each of the first optical path forming member and the second optical path forming member includes a light guide rod in a square shape, and the inlet side of each of the optical path forming members is on a base end side of the light guide rod.

13. The edge exposure method as set forth in claim 12, wherein the first mounting table and the second mounting table are placed one on the other.

14. An edge exposure apparatus for exposing an edge portion of a substrate having a photosensitive thin film formed thereon by a light source for exposure, comprising:

a first optical path forming member and a second optical path forming member with respective inlet sides arranged within light beams from said light source;

a first mounting table configured to be rotatable about a vertical axis while mounting the substrate thereon, and provided such that the edge portion of the substrate is located within an application region of the light beams from an outlet side of said first optical path forming member;

a second mounting table configured to be rotatable about a vertical axis while mounting the substrate thereon, and provided such that the edge portion of the substrate is located within an application region of the light beams from an outlet side of said second optical path forming member; and a light blocking means for blocking application of light from each of said first optical path forming member and said second optical path forming member, wherein each of said first optical path forming member and said second optical path forming member includes a light guide rod in a square shape, and the inlet side of each of said optical path forming members is on a base end side of said light guide rod.

15. The edge exposure apparatus as set forth in claim 14, wherein said light blocking means has means for relatively moving said first optical path forming member and second optical path forming member and said light source between a state where one of the inlet sides of said first optical path forming member and second optical path forming member is located within the light beams from said light source and the other is not located within the light beams, and a state where both of the inlet sides of said first optical path forming member and second optical path forming member are located within the light beams from said light source.

16. The edge exposure apparatus as set forth in claim 14, wherein said first mounting table and said second mounting table are placed one on the other.

17. The edge exposure apparatus as set forth in claim 14, wherein each of said optical path forming members includes a light guide rod made by forming a reflecting film on a side peripheral surface of a quartz rod.

18. The edge exposure apparatus as set forth in claim 14, wherein optical path lengths of said first optical path forming member and said second optical path forming member are equal.

* * * * *